(12) United States Patent
Hayashi

(10) Patent No.: US 6,341,052 B2
(45) Date of Patent: *Jan. 22, 2002

(54) MAGNETORESISTIVE ELEMENT INCLUDING A SILICON AND/OR A DIFFUSION CONTROL LAYER

(75) Inventor: Kazuhiko Hayashi, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/234,508

(22) Filed: Jan. 21, 1999

(30) Foreign Application Priority Data

Jan. 22, 1998 (JP) .......................... 10-010505

(51) Int. Cl.[7] ................................. G11B 5/39
(52) U.S. Cl. .................................... 360/324.1
(58) Field of Search .......................... 360/317

(56) References Cited

U.S. PATENT DOCUMENTS 5,850,325 A * 12/1998 Miyauchi .................... 360/317
5,998,016 A * 12/1999 Sasaki ......................... 360/113
6,074,743 A *  6/2000 Araki ......................... 360/324.1

FOREIGN PATENT DOCUMENTS

| JP | Hei8-213238 | 8/1996 |
| JP | Hei8-315326 | 11/1996 |
| JP | 9-186375 | 7/1997 |
| JP | 10-504926 | 5/1998 |

OTHER PUBLICATIONS

Japanese Office Action, dated Jan. 25, 2000, with English language translation of Japanese Examiner's comments.

English translation of Japanese Office Action dated Mar. 15, Hei 11.

* cited by examiner

Primary Examiner—A. J. Heinz
(74) Attorney, Agent, or Firm—McGuireWoods LLP

(57) ABSTRACT

An MR (magnetoresistive) effect element includes a free magnetic layer having a small coercive force and therefore reduces the hysteresis of the R-H loop. The magneoresistive element includes a silicon and/or a diffusion control layer. An MR effect sensor and an MR sensing system using the above MR effect element and featuring a desirable noise characteristic are also disclosed.

17 Claims, 13 Drawing Sheets

Fig. 5

| SUBSTRATE TEMPERATURE (°C) | COERCIVE FORCE (Oe) | SATURATION MAGNETIC FIELD (Oe) | MR RATIO (%) |
|---|---|---|---|
| 50 | 1.0 | 4.6 | 7.1 |
| 75 | 1.0 | 4.7 | 7.2 |
| 100 | 1.1 | 4.6 | 6.9 |
| 150 | 1.2 | 4.5 | 6.7 |
| 200 | 1.2 | 4.7 | 6.4 |
| 250 | 1.4 | 4.6 | 5.5 |
| 300 | 1.3 | 5.0 | 4.6 |
| 350 | 1.3 | 5.7 | 2.1 |

Fig. 6

| SUBSTRATE TEMPERATURE (°C) | COERCIVE FORCE (Oe) | SATURATION MAGNETIC FIELD (Oe) | MR RATIO (%) |
|---|---|---|---|
| 50 | 2.5 | 3.1 | 6.1 |
| 75 | 2.6 | 3.2 | 6.2 |
| 100 | 2.0 | 3.6 | 5.7 |
| 150 | 1.5 | 4.2 | 5.6 |
| 200 | 1.2 | 4.7 | 5.3 |
| 250 | 1.0 | 4.6 | 4.7 |
| 300 | 0.9 | 4.4 | 3.8 |
| 350 | 0.8 | 4.6 | 1.6 |

Fig. 7

| SUBSTRATE TEMPERATURE (°C) | COERCIVE FORCE (Oe) | SATURATION MAGNETIC FIELD (Oe) | MR RATIO (%) |
|---|---|---|---|
| 50 | 2.5 | 2.9 | 6.1 |
| 75 | 2.7 | 3.2 | 6.2 |
| 100 | 2.6 | 3.5 | 6.0 |
| 150 | 2.2 | 3.7 | 6.2 |
| 200 | 1.8 | 4.1 | 6.3 |
| 250 | 1.2 | 5.1 | 6.1 |
| 300 | 1.1 | 5.2 | 4.5 |
| 350 | 0.8 | 5.7 | 2.9 |

Fig. 8

| HEAT TREATMENT TEMPERATURE A (°C) | COERCIVE FORCE (Oe) | SATURATION MAGNETIC FIELD (Oe) | MR RATIO (%) |
|---|---|---|---|
| 50 | 1.1 | 4.8 | 7.0 |
| 75 | 0.9 | 4.7 | 7.2 |
| 100 | 1.1 | 4.9 | 7.1 |
| 150 | 1.1 | 4.7 | 6.9 |
| 200 | 1.3 | 4.9 | 6.6 |
| 250 | 1.3 | 4.8 | 5.9 |
| 300 | 1.4 | 5.1 | 4.8 |
| 350 | 1.3 | 5.8 | 2.6 |

Fig. 9

| HEAT TREATMENT TEMPERATURE A (°C) | COERCIVE FORCE (Oe) | SATURATION MAGNETIC FIELD (Oe) | MR RATIO (%) |
|---|---|---|---|
| 50 | 2.6 | 3.2 | 6.2 |
| 75 | 2.5 | 3.3 | 6.2 |
| 100 | 2.1 | 3.7 | 5.6 |
| 150 | 1.4 | 4.3 | 5.5 |
| 200 | 1.0 | 4.8 | 5.2 |
| 250 | 1.1 | 4.8 | 4.6 |
| 300 | 1.0 | 4.6 | 3.7 |
| 350 | 1.0 | 4.9 | 1.9 |

Fig. 10

| HEAT TREATMENT TEMPERATURE A (°C) | COERCIVE FORCE (Oe) | SATURATION MAGNETIC FIELD (Oe) | MR RATIO (%) |
|---|---|---|---|
| 50 | 1.1 | 4.8 | 7.2 |
| 75 | 1.2 | 4.6 | 7.0 |
| 100 | 1.0 | 4.7 | 6.8 |
| 150 | 1.3 | 4.5 | 6.7 |
| 200 | 1.2 | 4.5 | 6.8 |
| 250 | 1.3 | 4.7 | 6.6 |
| 300 | 1.4 | 5.2 | 5.2 |
| 350 | 1.3 | 5.9 | 3.6 |

Fig. 11

| HEAT TREATMENT TEMPERATURE A (°C) | COERCIVE FORCE (Oe) | SATURATION MAGNETIC FIELD (Oe) | MR RATIO (%) |
|---|---|---|---|
| 50 | 1.2 | 4.9 | 7.1 |
| 75 | 1.2 | 4.9 | 7.0 |
| 100 | 1.0 | 4.8 | 6.9 |
| 150 | 1.3 | 4.7 | 6.9 |
| 200 | 1.3 | 4.8 | 6.8 |
| 250 | 1.4 | 4.9 | 6.5 |
| 300 | 1.4 | 5.3 | 5.0 |
| 350 | 1.5 | 6.1 | 3.4 |

Fig. 12

| HEAT TREATMENT TEMPERATURE A (°C) | COERCIVE FORCE (Oe) | SATURATION MAGNETIC FIELD (Oe) | MR RATIO (%) |
|---|---|---|---|
| 50 | 2.6 | 2.8 | 6.0 |
| 75 | 2.9 | 3.0 | 6.1 |
| 100 | 2.4 | 3.6 | 6.1 |
| 150 | 2.4 | 3.8 | 6.1 |
| 200 | 1.9 | 4.2 | 6.2 |
| 250 | 1.3 | 4.9 | 6.3 |
| 300 | 1.0 | 5.1 | 4.4 |
| 350 | 1.0 | 6.2 | 2.6 |

Fig. 13

| ALUMINA FILM THICKNESS (nm) | COERCIVE FORCE (Oe) | SATURATION MAGNETIC FIELD (Oe) | MR RATIO (%) |
|---|---|---|---|
| 1 | 1.1 | 4.9 | 7.1 |
| 3 | 1.0 | 4.8 | 6.9 |
| 5 | 1.1 | 4.6 | 7.2 |
| 10 | 1.2 | 4.8 | 7.2 |
| 30 | 1.0 | 4.6 | 7.1 |
| 50 | 0.9 | 4.5 | 7.0 |
| 100 | 1.2 | 4.9 | 7.2 |
| 500 | 1.1 | 4.6 | 7.2 |

Fig. 14

| ALUMINA FILM THICKNESS (nm) | COERCIVE FORCE (Oe) | SATURATION MAGNETIC FIELD (Oe) | MR RATIO (%) |
|---|---|---|---|
| 1 | 0.9 | 4.9 | 3.3 |
| 3 | 1.0 | 5.1 | 4.2 |
| 5 | 1.1 | 5.0 | 5.3 |
| 10 | 1.2 | 5.1 | 6.1 |
| 30 | 1.6 | 4.3 | 6.0 |
| 50 | 2.1 | 3.7 | 6.1 |
| 100 | 2.5 | 3.1 | 6.2 |
| 500 | 2.7 | 3.3 | 6.1 |

Fig. 15

| KIND OF DIFFUSION CONTROL LAYER | COERCIVE FORCE (Oe) | SATURATION MAGNETIC FIELD (Oe) | MR RATIO (%) |
|---|---|---|---|
| AL OXIDE | 1.0 | 4.8 | 7.0 |
| SI OXIDE | 1.2 | 5.1 | 6.9 |
| TA OXIDE | 1.1 | 4.9 | 6.8 |
| AL NITRIDE | 1.1 | 5.1 | 7.2 |
| SI NITRIDE | 1.0 | 5.0 | 7.1 |
| AL OXIDE/SI OXIDE MIXTURE (1:1) | 1.1 | 5.1 | 7.0 |
| AL OXIDE/AL NITRIDE MIXTURE (1:1) | 1.0 | 5.2 | 7.1 |
| AL OXIDE/SI NITRIDE MIXTURE (1:1) | 1.2 | 5.1 | 6.9 |
| AL OXIDE/SI NITRIDE LAMINATE FILM (5mm+5mm) | 1.1 | 5.0 | 7.1 |
| AL OXIDE/AL NITRIDE LAMINATE FILM (5mm+5mm) | 1.2 | 4.9 | 7.0 |
| AL OXIDE/SI NITRIDE LAMINATE FILM (5mm+5mm) | 1.1 | 5.1 | 7.0 |

Fig. 16

| KIND OF DIFFUSION CONTROL LAYER | COERCIVE FORCE (Oe) | SATURATION MAGNETIC FIELD (Oe) | MR RATIO (%) |
|---|---|---|---|
| AL OXIDE | 1.0 | 4.8 | 6.1 |
| SI OXIDE | 1.1 | 4.9 | 4.9 |
| TA OXIDE | 1.2 | 5.1 | 5.5 |
| AL NITRIDE | 1.0 | 5.0 | 6.0 |
| SI NITRIDE | 1.1 | 5.1 | 5.8 |
| AL OXIDE/SI OXIDE MIXTURE (1:1) | 1.0 | 4.9 | 6.1 |
| AL OXIDE/AL NITRIDE MIXTURE (1:1) | 1.1 | 4.8 | 6.2 |
| AL OXIDE/SI NITRIDE MIXTURE (1:1) | 1.2 | 5.1 | 6.0 |
| AL OXIDE/SI NITRIDE LAMINATE FILM (5mm+5mm) | 1.1 | 5.0 | 5.9 |
| AL OXIDE/AL NITRIDE LAMINATE FILM (5mm+5mm) | 1.0 | 5.1 | 6.0 |
| AL OXIDE/SI NITRIDE LAMINATE FILM (5mm+5mm) | 1.1 | 5.0 | 6.1 |

Fig. 17

WITH SPIN VALVE DIRECTLY FORMED ON GLASS SUBSTRATE

| KIND & THICKNESS OF FIXING LAYER | HEAT TREATMENT TEMPERATURE B(°C) | HEAT TREATMENT TIME (h) | COERCIVE FORCE (Oe) | SATURATION MAGNETIC FIELD (Oe) | MR RATIO (%) |
|---|---|---|---|---|---|
| NiMn (30nm) | 270 | 5 | 2.5 | 3.1 | 6.0 |
| PtMn (30nm) | 250 | 5 | 2.2 | 3.6 | 6.7 |
| IrMn (10nm) | 230 | 5 | 1.8 | 3.9 | 7.0 |
| RhMn (30nm) | 230 | 4 | 1.7 | 4.0 | 6.9 |
| PtPdMn(20nm) | 230 | 3 | 1.6 | 4.1 | 7.1 |
| ReMn (30nm) | 230 | 3 | 1.8 | 3.9 | 6.8 |
| PtCrMn(20nm) | 230 | 5 | 1.7 | 4.1 | 6.9 |
| CrMn (20nm) | 230 | 3 | 1.7 | 3.8 | 6.8 |
| CrAl (20nm) | 230 | 3 | 1.8 | 3.8 | 6.9 |
| TbCo (8nm) | 230 | 3 | 1.8 | 4.0 | 6.9 |
| NiO (30nm) | 230 | 3 | 2.1 | 5.1 | 8.1 |
| $Fe_2O_3$ (50nm) | 230 | 3 | 1.9 | 4.9 | 7.9 |
| NiCoO (30nm) | 230 | 3 | 1.9 | 5.0 | 8.0 |
| NiFeO (30nm) | 230 | 3 | 2.2 | 4.9 | 8.1 |
| NiO/CoO (30nm)(1nm) | 230 | 3 | 2.1 | 5.1 | 7.9 |
| NiO/$Fe_2O_3$ (30nm)(1nm) | 230 | 3 | 1.9 | 5.1 | 8.0 |
| CoCr (30nm) | 230 | 3 | 3.0 | 4.9 | 3.9 |
| CoCrPt(30nm) | 230 | 3 | 3.1 | 4.9 | 3.8 |
| CoCrTa(30nm) | 230 | 3 | 3.3 | 5.0 | 4.1 |
| CoPt (30nm) | 230 | 3 | 2.1 | 4.7 | 5.1 |

Fig. 18

WITH SPIN VALVE FORMED ON GLASS SUBSTRATE VIA SI/ALUMINA LAYER

| KIND & THICKNESS OF FIXING LAYER | HEAT TREATMENT TEMPERATURE B(°C) | HEAT TREATMENT TIME (h) | COERCIVE FORCE (Oe) | SATURATION MAGNETIC FIELD (Oe) | MR RATIO (%) |
|---|---|---|---|---|---|
| NiMn | 270 | 5 | 0.9 | 4.9 | 6.1 |
| PtMn | 250 | 5 | 1.1 | 5.1 | 6.2 |
| IrMn | 230 | 5 | 1.0 | 4.9 | 6.9 |
| RhMn | 230 | 4 | 1.0 | 4.9 | 6.8 |
| PtPdMn | 230 | 3 | 1.0 | 5.1 | 7.1 |
| ReMn | 230 | 5 | 1.1 | 5.0 | 7.1 |
| PtCrMn | 230 | 3 | 1.0 | 4.9 | 7.1 |
| CrMn | 230 | 3 | 1.2 | 5.1 | 6.9 |
| CrAl | 230 | 3 | 0.9 | 4.8 | 6.9 |
| TbCo | 230 | 3 | 1.1 | 6.0 | 7.0 |
| NiO | 230 | 3 | 1.4 | 5.7 | 6.9 |
| $Fe_2O_3$ | 230 | 3 | 1.3 | 6.4 | 7.1 |
| NiCoO | 230 | 3 | 1.4 | 5.9 | 8.4 |
| NiFeO | 230 | 3 | 1.2 | 6.1 | 8.7 |
| NiO/CoO | 230 | 3 | 1.2 | 6.2 | 8.6 |
| NiO/$Fe_2O_3$ | 230 | 3 | 1.3 | 5.8 | 8.7 |
| CoCr | 230 | 3 | 2.4 | 7.4 | 3.8 |
| CoCrPt | 230 | 3 | 2.5 | 7.1 | 4.1 |
| CoCrTa | 230 | 3 | 2.3 | 7.2 | 3.9 |
| CoPt | 230 | 3 | 1.8 | 6.9 | 4.2 |

MAGNETORESISTIVE ELEMENT INCLUDING A SILICON AND/OR A DIFFUSION CONTROL LAYER

BACKGROUND OF THE INVENTION

The present invention relates to magnetic sensor for reading data signals stored in a magnetic recording medium.

A magnetic read transducer called an MR (magnetoresistive) effect sensor or an MR effect head is conventional and capable of reading data out of a magnetic surface with high liner density, as reported in the past. The MR effect sensor or head senses a magnetic field signal in terms of the variation of resistance which is the function of the intensity and direction of a magnetic flux sensed by a reading device. The conventional read transducer is based on an AMR (Anisotropic Magneto Resistance) effect, i.e., the fact that one component of the resistance of a reading device varies in proportion to the square of the cosine of an angle between the direction of magnetization and the direction of a sense current flowing through the reading device.

For details of the AMR effect, reference may be made to D. A. Thompson et al. "Memory, Storage, and Related Applications", IEEE Trans. on Mag. MAG-11. p. 1039 (1975).

It is a common practice with a magnetic head utilizing the AMR effect to apply a longitudinal bias magnetic field for reducing Barkhausen noise. To apply the vertical bias magnetic field, use is sometimes made of FeMn, NiMn, nickel oxide or similar antiferromagnetic material. There has recently been reported a more noticeable MR effect, i.e., the fact that the resistance of a laminate magnetic sensor is ascribable to the spin-dependent transfer of conductive electrons occurring between magnetic layers via a nonmagnetic layer and spin-dependent diffusion occurring at an interface between layers due to the above transfer. This kind of MR effect is generally referred to as, e.g., a macro MR effect or a spin valve effect.

The above MR sensor is formed of a suitable material and has higher sensitivity than a sensor using the AMR effect and therefore noticeably varies in resistance. In this kind of MR effect sensor, two ferromagnetic layers are separated from each other by a nonmagnetic layer. Resistance in the plane between the two ferromagnetic layers varies in proportion to the cosine of an angle between the magnetization directions of the ferromagnetic layers.

Japanese Patent Laid-Open Publication No. 2-61572, for example, discloses a laminate magnetic structure featuring high MR variation based on the antiparallel alignment of magnetization in a magnetic layer. As for materials usable for the laminate structure, the above document mentions ferromagnetic transition metals and alloys. Further, the document teaches a structure in which an antiferromagnetic layer is added to one of at least two ferromagnetic layers, and indicates that FeMn is feasible for the antiferromagnetic layer.

Japanese Patent Laid-Open Publication No. 4-358310 proposes an MR sensor including two thin ferromagnetic layers separated from each other by a thin nonmagnetic metal layer. When no magnetic field is applied to this MR sensor, the magnetization directions of the two ferromagnetic layers are perpendicular to each other. Resistance between the two non-coupled ferromagnetic layers varies in proportion to the cosine of the angle between the above magnetization directions independently of the direction of current flowing through the sensor.

Japanese Patent Laid-Open Publication No. 6-203340 discloses an MR sensor also based on the above effect and including two thin ferromagnetic layers separated by a nonmagnetic thin metal layer. When the outside magnetic field is zero, the magnetization of an adjoining antiferromagnetic layer remains perpendicular to the magnetization of the other ferromagnetic layer.

Japanese Patent Laid-Open Publication No. 7-262529 teaches an MR effect element or spin valve made up of a first magnetic layer, a nonmagnetic layer, a second magnetic layer, and an antiferromagnetic layer. For the first and second magnetic layers, use is made of CoZrNb, CoZrMo, FeSiAl, FeSi or NiFe with or without Cr, Mn, Pt, Ni, Cu, Ag, Al, Ti, Fe, Co or Zn added thereto.

Japanese Patent Laid-Open Publication No. 7-202292 proposes an MR effect film including a plurality of magnetic thin films laminated on a substrate and separated by a nonmagnetic layer. An antiferromagnetic thin layer adjoins one of soft magnetic thin films adjoining each other with the intermediary of a nonmagnetic thin film. Assume that a bias magnetic field applied to the antiferromagnetic thin film is $H_r$, and that the coercive force of the other soft magnetic thin film is $H_{eZ}$. Then, a relation $H_{o2}<H_r$ holds. The antiferromagnetic material is implemented by at least one of NiO, CoO, FeO, $Fe_2O_2$, MnO and Cr or a mixture thereof.

Japanese Patent Laid-Open Publication No. 8-127864 teaches an MR effect film similar to the above film, except that the antiferromagnetic thin layer is implemented as a superlattice consisting of at least two of NiO, $Ni_xCo_{1-x}O$ and CoO.

Further, Japanese Patent Laid-Open Publication No. 8-204253 discloses an MR effect film similar to the above film except that the antiferromagnetic layer is a superlattice consisting of at least two of NiO, $Ni_xCo_{1-x}O=(x=0.1–0.9)$, and CoO. In the superlattice, the ratio of Ni to Co in the number of atoms is greater than 1.0 inclusive.

As for an effect MR element basically consisting of a free magnetic layer, a nonmagnetic layer, a fixed magnetic layer and a fixing magnetic layer, it is preferable that the free magnetic layer has an easy axis of a uniaxial magnetic anisotropy substantially perpendicular to the magnetization direction of the fixed layer.

The above type of MR effect element should preferably be designed and used such that the magnetization direction of the free magnetic layer and that of the fixed layer are substantially perpendicular to each other in a zero magnetic field. At this instant, if the easy axis direction of the free magnetic layer and the magnetization direction of the fixed layer make an angle close to a right angle, then a magnetic field (leakage magnetic field from a record mark on a magnetic recording medium with respect to the operation of a read head) is applied in the hard axis direction of the free magnetic layer. This successfully reduces the coercive force of the free magnetic layer and thereby reduces the hysteresis of the R-H loop when the MR effect element is used as a read sensor. It is therefore possible to reduce the noise of a reproduced signal.

However, many of the conventional MR elements use an antiferromagnetic material for the fixing layer. Further, many of antiferromagnetic materials expected to be put to practical use as a fixing layer must be heated at temperature above 200° C. in a magnetic field parallel to the magnetization direction of the fixed layer, so that a sufficient exchange coupled magnetic field can be applied to the fixed layer.

In each of the conventional MR effect element of the type described, the antiferromagnetic layer is formed after the formation of the free magnetic layer, nonmagnetic layer, and fixed magnetic layer. Therefore, the above heat treatment acts not only on the fixed magnetic layer and fixing magnetic layer but also on the free magnetic layer. Consequently, the easy axis of the uniaxial magnetic anisotropy of the free magnetic layer is oriented parallel to the direction of the magnetic field, i.e., the magnetization direction of the fixed magnetic layer. This increases the coercive force of the free magnetic layer and thereby increases noise when the MR effect film is used as a sensor.

Technologies relating to the present invention are also disclosed in, e.g., Japanese Patent Laid-Open Publication No. 9-199326.

SUMMARY OF THE INVENTION

It is therefore an object of the present invention to provide an MR effect element capable of reducing the coercive force of its free magnetic layer and therefore the hysteresis of the R-H loop, and an MR effect sensor and an MR sensing system using the same and featuring a desirable noise characteristic.

In accordance with the present invention, in an MR effect element, a laminate film is implemented by a unit consisting of an Si layer, a metal lower layer, a free magnetic layer, a nonmagnetic layer, a fixed layer, and a magnetic fixing layer.

Also, in accordance with the present invention, in an MR effect element, a laminate film is implemented by a unit consisting of an Si layer, a diffusion control layer, a metal lower layer, a free magnetic layer, a nonmagnetic layer, a fixed layer, and a magnetic fixing layer.

BRIEF DESCRIPTION OF THE DRAWINGS

The above and other objects, features and advantages of the present invention will become more apparent from the following detailed description taken with the accompanying drawings in which:

FIG. 5 is a table listing the coercive forces and saturation magnetic fields of a free magnetic layer and magnetoresistance (MR) ratios measured at different substrate temperatures;

FIGS. 6 and 7 are tables each listing the coercive forces and saturation magnetic fields of free magnetic layers included in samples and MR ratios measured after heat treatment;

FIG. 8 is a table listing the coercive forces and saturation magnetic fields of a free magnetic layer and MR ratios measured at different heat treatment temperatures (heat treatment temperatures A);

FIG. 9 is a table listing the coercive forces and saturation magnetic fields of free magnetic layers included in samples and MR ratios measured after heat treatment;

FIG. 10 is a table listing the coercive forces and saturation magnetic fields of a free magnetic layer and MR ratios measured at different substrate temperatures;

FIG. 11 is a table listing the coercive forces and saturation magnetic fields of a free magnetic layer and MR ratios measured at different heat treatment temperatures (heat treatment temperatures B);

FIG. 12 is a table listing the coercive forces and saturation magnetic fields of free magnetic layers included in samples and MR ratios measured after heat treatment;

FIG. 13 is a table listing the coercive forces and saturation magnetic fields of a free magnetic layer and MR ratios in relation to different thicknesses of an alumina layer;

FIG. 14 is a table listing the coercive forces and saturation magnetic fields of free magnetic layers included in samples and MR ratios measured after heat treatment;

FIG. 15 is a table listing the coercive forces and saturation magnetic fields of a free magnetic layer and MR ratios in relation to diffusion control layers of different kinds;

FIG. 16 is a table listing the coercive forces and saturation magnetic fields of free magnetic layers included in samples and MR ratios measured after heat treatment; and FIGS. 17 and 18 are tables each listing the coercive forces and saturation magnetic fields of a free magnetic layer and MR ratios in relation to diffusion control layers of different kinds.

DESCRIPTION OF THE PREFERRED EMBODIMENTS

Figure 1:
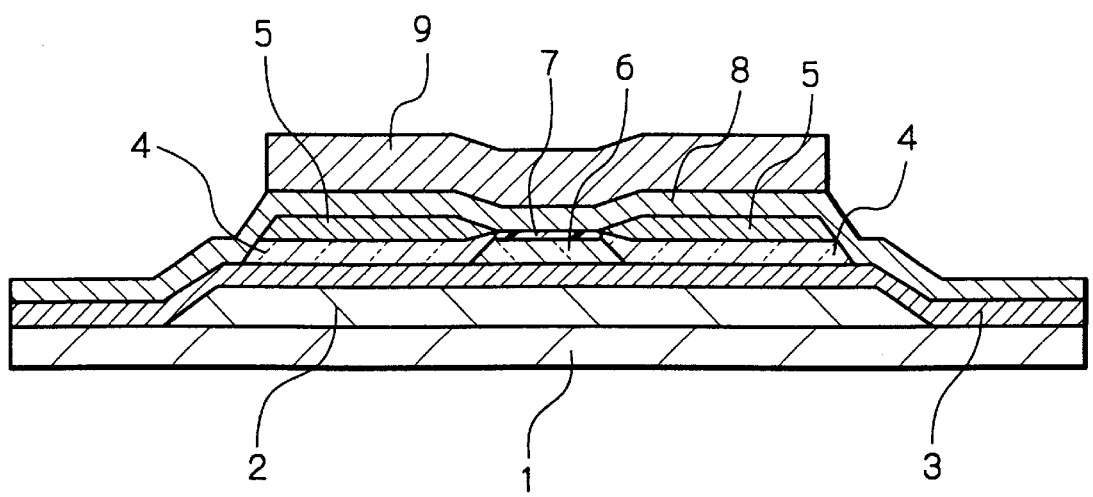
FIGS. 1 and 2 each shows a particular typical configuration of an MR sensor.
Figure 2:
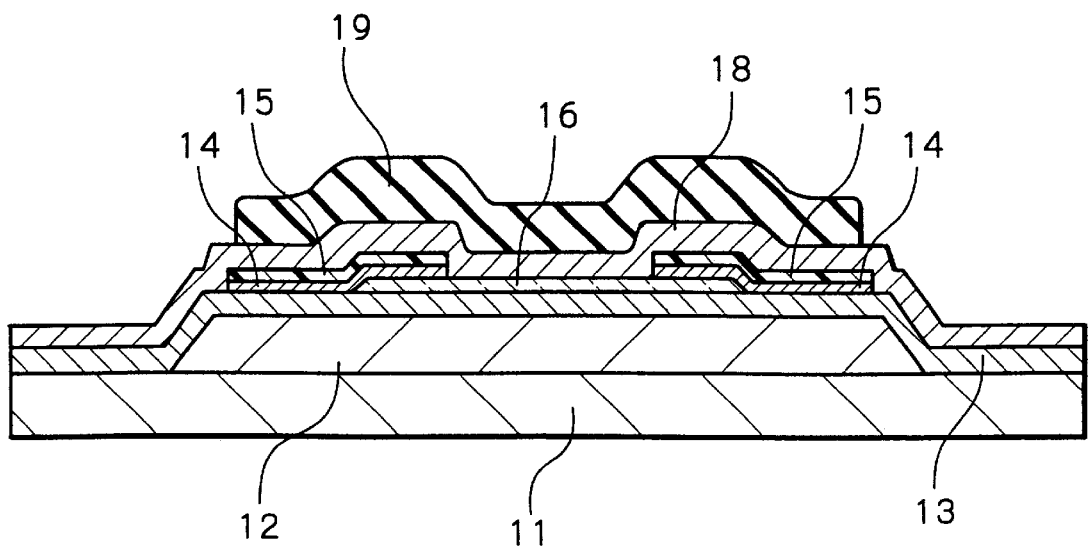

FIGS. 1 and 2 show two different typical shield type devices to which the present invention is applied. The device shown in FIG. 1 includes a substrate 1. A lower shield layer 2, a lower gap layer 3 and MR effect element 6 sequentially laminated on the substrate 1. An insulating layer 7 for determining a gap may be formed on the MR effect element 6, as the case may be. The lower shield layer 2 is, in many cases, patterned in a suitable size by a photoresist (PR) step. The MR effect element 6 is also patterned in a suitable size by a PR step. A longitudinal bias layer 4 and a lower electrode layer 5 are sequentially formed in such a manner as to contact the edges of the MR effect element 6. An upper gap layer 8 and an upper shield layer 9 are sequentially laminated on the layers 4 and 5.

The device shown in FIG. 2 includes a lower shield layer 12, a lower gap layer 13 and an MR effect element 16 sequentially laminated on a substrate 11. The lower shield layer 12 is, in many cases, patterned in a suitable size by a PR step. The MR effect element 16 is also patterned in a suitable size by PR step. A longitudinal bias layer 14 and a lower electrode layer 15 are sequentially formed in such a manner as to partly overlap the MR effect element 16. An upper gap layer 18 and an upper shield layer 19 are sequentially laminated on the layers 14 and 15.

For the lower shield layer 2 or 12, use may be made of, e.g., an NiFe, CoZr, CoFeB, CoZrMo, CpZrNb, CoZr, CoZrTa, CoHf, CoTa, CoTaHf, CoNbHf, CoZrNb, CoHfPd, CoTaZrNb or CoZrMoNi alloy, FeAlSi or iron nitride. The shield layer 2 or 12 should preferably be 0.3 $\mu$m to 10 $\mu$m thick.

The lower gap layer 3 or 13 may advantageously be formed of, e.g., alumina, $SiO_2$, aluminum nitride, silicon nitride or diamond-like carbon. The thickness of the lower gap layer 3 or 13 should preferably be 0.01 $\mu$m to 0.20 $\mu$m.

The lower electrode layer 5 or 15 may advantageously be formed of Zr, Ta or Mo or an alloy or a mixture thereof. The lower electrode layer 5 or 15 should preferably be 0.01 $\mu$m to 0.10 $\mu$m thick. For the longitudinal bias layer 4 or 14, use may be made of CoCrPt, CoCr, CoPt, CoCrTa, FeMn, NiMn, IrMn, PtPdMn, ReMn, PtMn, CrMn, Ni oxide, ion oxide, an Ni oxide and Co oxide mixture, an Ni oxide and Fe oxide mixture, an Ni oxide and Co oxide film or an Ni oxide and Fe oxide film by way of example.

The insulating layer 7 for determining a gap may advantageously be formed of alumina, $SiO_2$, aluminum nitride, silicon nitride or diamond-like carbon and should preferably be 0.005 µm to 0.05 µm thick.

The upper gap layer 8 or 18 may be formed of alumina, $SiO_2$, aluminum nitride, silicon nitride or diamond-like carbon by way of example and should preferably be 0.01 µm to 0.20 µm thick.

Further, the upper shield layer 9 or 19 may be formed of, e.g., NiFe or CoZr or CoFeB, CoZrMo, CoZrNb, CoZr, CoZrTa, CoHf, CoTa, CoTaHf, CoNbHf, CoZrNb, CoHfPd, CoTaZrNb or CoZrMoNi alloy, FeAlSi or ion nitride. The thickness of the upper shield layer 1 or 19 should preferably be between 0.3 µm and 10 µm.

The shield type devices shown in FIGS. 1 and 2 each can implement a read/write head with an inductive coil forming a write head portion.

Figure 3:
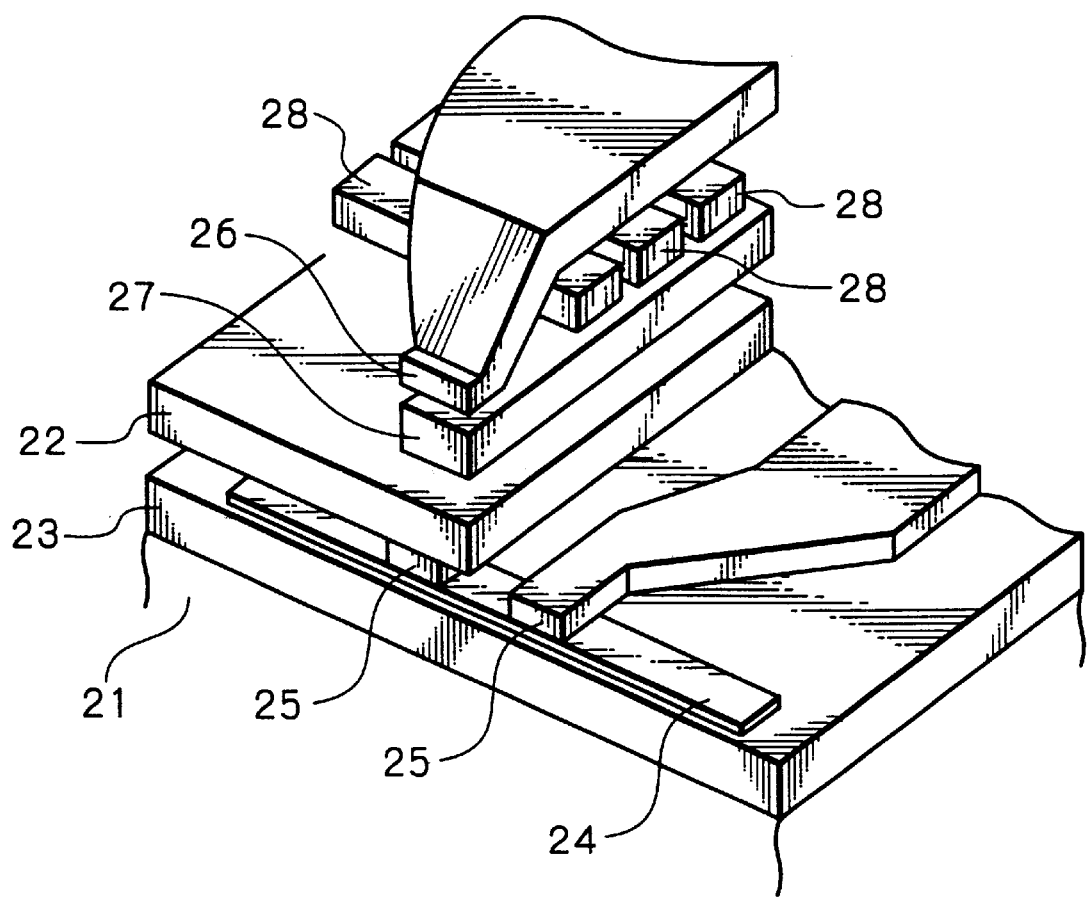
FIG. 3 is a perspective view showing the general construction of a read/write head.

FIG. 3 shows a specific configuration of a read/write head. As shown, the read/write head is made up of a read head implemented by the MR effect element of the present invention and an interactive write head. While the MR effect element is combined with the write head adapted for longitudinal magnetic recording, it may be combined with a vertical write head used for vertical magnetic recording.

Specifically, the head shown in FIG. 3 has a slider or base 21. A read head is formed on the slider 21 and made up of an upper shield film 22, a lower shield film 23, an MR effect film 24, and an electrode film 25. A write head is formed on the read head and made up of an upper magnetic film 26, a lower magnetic film 27, and a coil 28. The upper shield film 22 or the read head and the lower magnetic film 27 of the write head may be implemented as a single magnetic film, if desired.

The read/write head with the above configuration selectively records signals in a magnetic recording medium or reproduces them from the recording medium. As shown in FIG. 3, the sensing portion of the read head and the magnetic gap of the write head lie one above the other and can therefore be positioned at the same track at the same time. After the slider has been machined, the read/write head is mounted to a support member, provided with wirings, and then mounted to a magnetic recording/reproducing apparatus.

Figure 4:
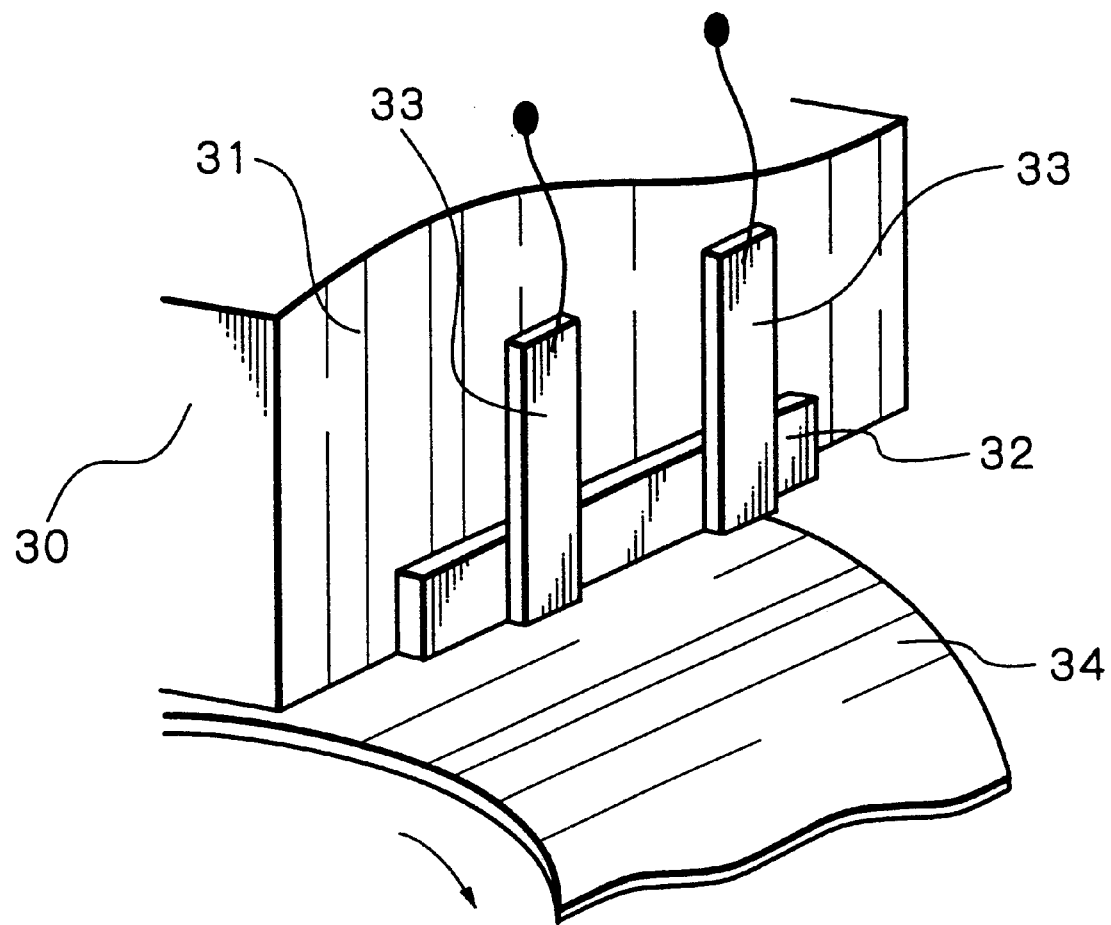
FIG. 4 shows the general configuration of a recording/reproducing apparatus.

FIG. 4 shows a specific configuration of a recording/reproducing apparatus using the MR effect element of the present invention. As shown, an MR effect film 32 and an electrode film 33 are formed on a base 31 playing the role of a head slider 30 at the same time. After the head slider 31 has been machined, it is provided with wirings and then mounted to the apparatus. A positioning mechanism, not shown, positions the head slider 30 at a preselected track formed on a magnetic recording medium 34.

A drive motor, not shown, causes the recording medium 34 to spin. The head slider 30 moves relative to the recording medium 34 at a height of 0.2 m or more above the medium 34 or in contact with the medium 34. In this condition, the MR effect film 32 reads a magnetic signal out of the recording medium 34 in the form of a leakage magnetic field.

Figure 1A:
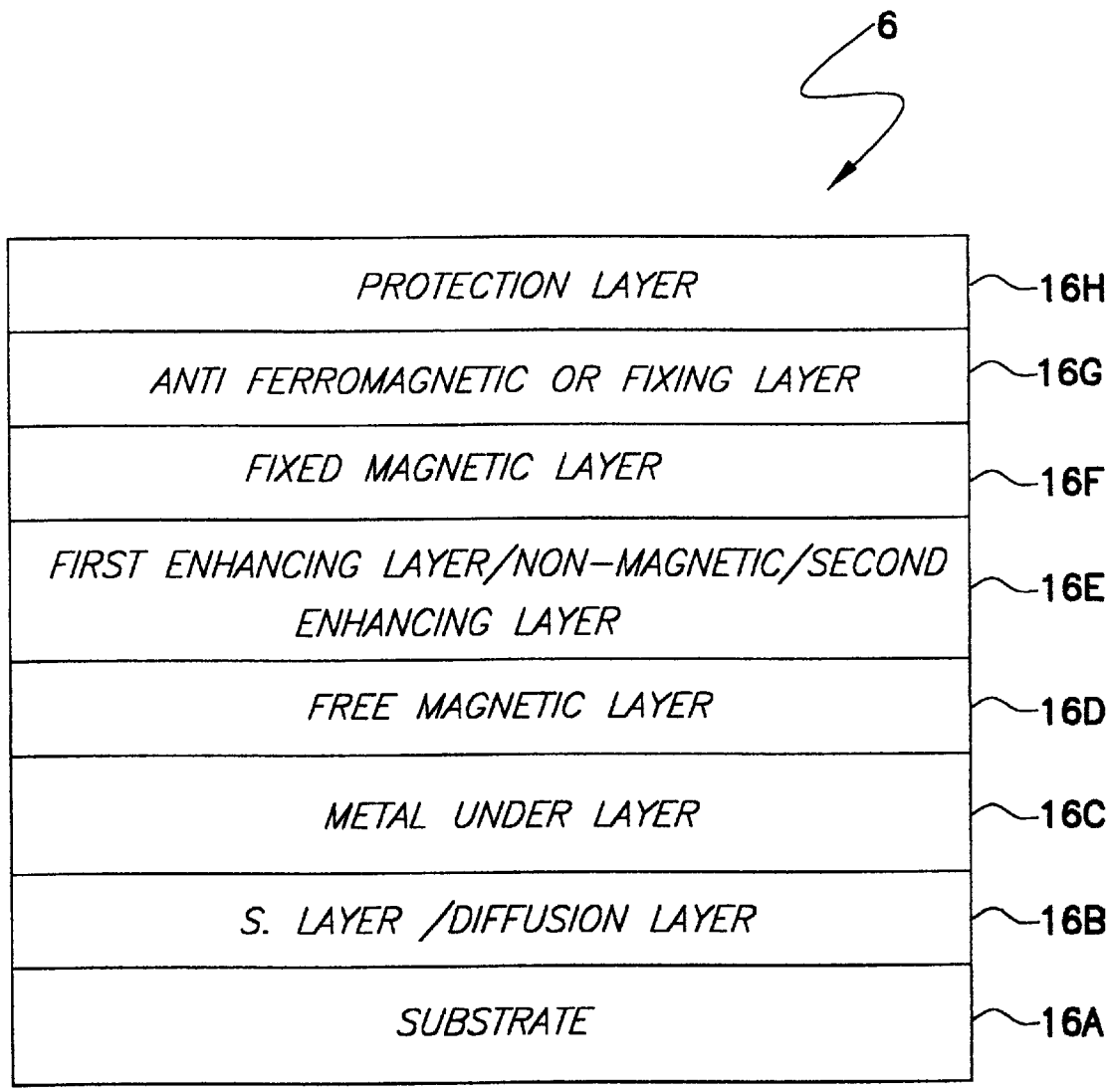
FIG. 1a shows a schematic diagram of an MR element unit used in the particular MR sensor of FIGS. 1 and 2 of the present invention.

The MR element may have any one of the following different structures (1) through (6) as described below and shown in FIG. 1a. In FIG. 1a, an Si layer 16b is formed on a substrate layer 16a. In embodiments, the Si layer 16b may represent a layered structure of an Si layer and a diffusion control layer. A metal under layer 16c is formed on the layer 16b (e.g., the Si layer or the diffusion layer (when used)). A free magnetic layer 16d is formed on the metal under layer 16c. Formed on the free magnetic layer 16d is layer 16e which represents a non-magnetic layer. In embodiments, the layer 16e may represent a first enhancing layer and the non-magnetic layer, where the first enhancing layer is formed between the non-magnetic layer and the free magnetic layer 16d. Alternatively, the layer 16e may represent a sandwiched layer of the first enhancing layer, the non-magnetic layer and a second enhancing layer. In the alternative embodiments, the diffusion layer may be used in combination with both or either of the first and second enhancing layers. A fixed magnetic layer 16f is formed on layer 16e, and layer 16g is formed on layer 16f. Layer 16g may represent either an antiferromagnetic layer or a fixing layer. A protection layer 16h is formed on the layer 16g. In more detail and according to the preferred embodiments of the present invention, examples (1) through (6) show the specific structures of the MR element as shown in FIG. 1a, where each MR element has at least an Si layer, a metal under layer, a free magnetic layer, a non magnetic layer, a fixed layer and a protection layer.

(1) substrate/Si layer/metal under layer/free magnetic layer/nonmagnetic layer/fixed magnetic layer/antiferromagnetic layer/protection layer;

(2) substrate/Si layer/metal under layer/free magnetic layer/first MR enhancing layer/nonmagnetic layer/fixed magnetic layer/fixing layer/protection layer;

(3) substrate/Si layer/metal under layer/free magnetic layer/first MR enhancing layer/nonmagnetic layer/second MR enhancing layer/fixed magnetic layer/fixing layer/protection layer;

(4) substrate/Si layer/diffusion control layer/metal under layer/free magnetic layer/nonmagnetic layer/fixed magnetic layer/antiferromagnetic layer/protection layer;

(5) substrate/Si layer/diffusion control layer/metal under layer/free magnetic layer/first MR enhancing layer/nonmagnetic layer/fixed magnetic layer/fixing layer/protection layer; and (6) substrate/Si layer/diffusion control layer/metal under layer/free magnetic layer/first MR enhancing layer/nonmagnetic layer, second MR enhancing layer/fixed magnetic layer/fixing layer/protection layer.

For the diffusion control layer, use may be made of Ta, Hf, Zr, W, Cr, Ti, Mo, Pt, Ni, Ir, Cu, Ag, Co, Zn, Ru, Rh, Re, Au, Os, Pd, Nb, V or similar metal, an oxide or a nitride of Si, Ta, Al, Ti, V, Cr, Mn, Hf, Zr, W, Mo, Ni, Zn or similar metal, a mixture of the oxide and nitride, or a mixture or a laminate of the metal and oxide and nitride mixture.

The metal under lay may be implemented by one or more metals in the form of a single film or a laminate. Specifically, use may be made of a single film, a mixture film or a laminate consisting of Ta, Hf, Zr, W, Cr, Ti, Mo, Pt, Ni, Ir, Cu, Ag, Co, Zn, Ru, Rh, Re, Au, Os, Pd, Nb and V.

The free magnetic layer may be formed of NiFe, CoFe, NiFeCo, FeCo, CoFeB, CaZrMo, CoZrNb, CoZr, CoZrTa, CoHf, CoTa, CoTaHf, CoHbHf, CoZrNb, CoHfPd, CoTaZrNb or CoZrMoNi alloy or an amorphous magnetic substance. This layer should preferably be about 1 nm to 10 nm thick.

As for the nonmagnetic layer, there may be used Cu with or without about 1 at % to 20 at % of Ag added thereto, Cu with about 1 at % to 20 at % of Re added thereto or a Cu—Au alloy. The nonmagnetic layer should preferably be 2 nm to 4 nm thick.

The first and second MR enhancing layers each may be formed of Co, NiFeCo or FeCo, a CoFeB, CoZrMo, CoZrNb, CoZr, CoZrTa, CoHf, CaTa, CoTaHf, CoNbHf, CoZrNb, CoHfPd, CoTaZrNb or CoZrMoNi alloy, or an amorphous magnetic material and should preferably be about 0.5 nm to 5 nm thick.

When neither the first nor the second MR enhancing layer is present, the MR ratio decreases. However, the number of steps for fabrication is successfully reduced due to the absence of the MR enhancing layers. For the fixed magnetic layer, use may be made of metal selected from a group of Co—, Ni— and Fe-based metals or an alloy or a laminate thereof. The fixed magnetic layer should preferably be about 1 nm to 50 nm thick.

The fixing layer may be implemented by FeMn, NiMn, IrMn, RhMn, PtPdMn, ReMn, PtMn, PtCrMn, CrMn, CrAl, TbCo, Ni oxide, Fe oxide, Ni oxide and Co oxide mixture, Ni oxide and Fe oxide mixture, laminate Ni oxide and Co oxide film, laminate Ni oxide and Fe oxide film, CoCr, CoCrPt, CoCrTa or PtCo.

As for the protection layer, use is made of metal oxide or nitride, an oxide and nitride mixture, or a laminate metal and oxide film, a laminate metal and nitride film or a laminate metal and oxide and nitride mixture film. Other hopeful candidates are T, V, Cr, Co, Cu, Zn, Y, Zr, Nb, Mo, Tc, Ru, Rh, Pd, Ag, Hf, Ta, W, Re, Os, Ir, Pt or Au, or an oxide or a nitride selected from a group consisting of Si, Al, Ti and Ta or a mixture thereof, or a mixture of the above oxide, nitride or a mixture thereof and one element or an ally of two or more elements selected from a group consisting of Ta, Hf, Zr, W, Cr, Ti, Mo, kPt, Ni, Ir, Cu, Ag, Co, Zn, Ru, Rh, Re, Au, Os, Pd, Nb, V and Y and implemented as a laminate film.

Examples of the present invention will be described hereinafter. First, for comparison, an MR effect film lacking an Si layer was produced. This MR film had a glass substrate/Ta (3 nm)/NiFe (6 nm)/CoFe (1 nm)/Cu (2.7 nm)/CoFe (3 nm)/FeMn (10 nm)/Ta (3 nm) structure. Magnetic fields different by 90 degrees from each other were respectively applied to the NiFe (6 nm)/CoFe (1 nm) portion and CoFe (3 nm)/FeMn(10 nm) portion at the time of film formation.

A magnetic film parallel to the magnetic field used to form the CoFe/FeMn portion was applied to the above MR effect film in order to measure an R-H loop. The measurement showed that the free magnetic layer had a coercive force of 1 Oe and a saturation magnetic field of 5 Oe. The MR ratio was measured to be 7%.

On the other hand, while a magnetic field of 500 Oe parallel to the magnetic field used to form the CoFe/FeMo portion was applied to the comparative MR effect film, the film was heated at 270° C. for 5 hours in vacuum. As a result, the coercive force of the free magnetic layer increased to 2.5 Oe while the saturation magnetic field of the same decreased to 30 Oe. The increase in coercive force and the decrease in saturation magnetic field indicate that the anisotropy of the free magnetic layer noticeably rotated in the direction of application of the magnetic field during heat treatment. After the heat treatment, the MR ratio was found to be 6%.

An MR effect element with a glass substrate/Si (10 nm)/Ta (3 nm)/NiFe (6 nm)/CoFe (1 nm)/Cu (2.7 nm)/CoFe (3 nm)/FeMn (10 nm)/Ta (3 nm) structure was produced. Specifically, for the Si/Ta/NiFe/CoFe portion, a magnetic field of about 100 Oe was applied while the substrate temperature was varied. After the sufficient cooling of the portion, this Cu/CoFe/FeMn/Ta portion was formed.

FIG. 5 shows how the coercive force and saturation magnetic field of the free magnetic layer and the MR ratio varied in accordance with the substrate temperature. As shown, the coercive force and saturation magnetic field tended to increase as the substrate temperature rose although such a tendency was not clearly accounted for. The MR ratio slowly decreased with the elevation of substrate temperature up to 250° C., but sharply fell at temperatures above 250° C.

The above MR effect film was subjected to a magnetic field of 500 Oe parallel to the magnetic field used to form the CoFe/FeMn portion and was heated at 270° C. (heat treatment temperature B hereinafter) for 5 hours. FIG. 6 tabulates the coercive forces and saturation magnetic fields of the free magnetic layer subjected to the heat treatment temperatures B and MR ratios. As shown, the coercive force decreased and the saturation magnetic field increased at substrate temperatures of 150° C. and above. It will be seen that by the heat treatment effected at temperatures of 150° C. and above, the rotation of the free magnetic layer in the direction of anisotropy and ascribable to the Si layer can be reduced.

An MR effect element with a glass substrate/Si (10 nm)/Ta (3 nm)/NiFe (6 nm)/CoFe (1 nm)/Cu (2.7 nm)/CoFe (3 nm)/FeMn (10 nm)/Ta (3 nm) structure was produced. After the formation of the Si/Ta/NiFe/CoFe portion, the laminate was heated in a magnetic field of about 100 Oe applied in the same direction as the magnetic field used for film formation. After the sufficient cooling of this portion, the Cu/CoFe/FeMn/Ta portion was formed.

FIG. 8 lists the coercive forces and saturation magnetic fields of the free magnetic layer subjected to the above treatment temperature (heat treatment temperature A hereinafter) and MR ratios. As shown, the coercive force and saturation magnetic fields tended to increase with the elevation of heat treatment temperature A in the same manner as when the substrate temperature was varied. The MR ratio slowly decreases in accordance with the heat treatment temperature up to 250° C., but sharply fell at temperatures above 250° C.

A sample identical in configuration with the above MR effect element was heated at 270° C. (heat treatment temperature B) for 5 hours in a magnetic field of 500 Oe parallel to the magnetic field used to form the CoFe/FeMn portion. The resulting coercive forces and saturation magnetic fields of the free magnetic layer and MR ratios are listed in FIG. 9. As shown, at temperatures of 100° C. and above, the coercive force and saturation magnetic field of the free magnetic layer decreased and increased, respectively. It will be seen that at temperatures higher than 100° C. inclusive the rotation of the free magnetic layer in the direction of anisotropy and ascribable to the Si layer can be reduced.

An MR effect element with a glass substrate (10 nm)/ alumina (10 nm)/Ta (3 nm)/NiFe (5 nm)/CoFe (1 nm)/Cu (2.7 nm)/CoFe (3 nm)/FeMn (10 nm)/Ta (3 nm) structure was produced. Specifically, the Si/alumina/Ta/NiFe/CoFe portion was formed in a magnetic field of 100 Oe with the substrate temperature being varied. After the sufficient cooling of this portion, the Cu/CoFe/FeMn/Ta portion was formed. Magnetic fields different by 90 degrees from each other were respectively assigned to the NiFe (6 nm)/CoFe (1 nm) portion and CoFe (3 nm)/FeMn (10 nm) portion. FIG. 10 shows the coercive forces and saturation magnetic fields of the free magnetic layer and MR ratios in relation to various substrate temperatures. As shown, the coercive force and saturation magnetic field tended to slightly increase with the elevation of substrate temperature although such a tendency was not clearly accounted for. The MR ratio slowly decreased in accordance with the elevation of the substrate temperature up to 250 °C., but rather sharply fell at temperatures above 250° C.

A sample identical in configuration with the above MR effect element was heated at 270° C. (heat treatment temperature B) for 5 hours in a magnetic field of 500 Oe parallel to the magnetic field used to form the CoFe (3 nm)/FeMn (10 nm) portion. FIG. 7 lists the resulting coercive forces and saturation magnetic fields of the free magnetic layer and MR ratios. As shown, at temperatures higher than 150° C. inclusive, the coercive force and saturation magnetic fields of the free magnetic layer decreased and increased, respectively. It will be seen that at temperatures higher then 150° C. inclusive the rotation of the free magnetic layer in the direction of anisotropy layer and ascribable to the Si layer/alumina layer can be reduced. Further, the lower limit of the substrate temperature capable of reducing the rotation of the free magnet layer was higher when the alumina layer was present than when it was absent; the diffusion of Si from the Si layer to the Ta/NiFe/CoFe layer is slowed down.

An MR film with a glass substrate/Si (10 nm)/alumina (10 nm)/Ta (3 nm)/NiFe (6 nm)/CoFe (1 nm)/Cu (2.7 nm)/CoFe (3 nm)/FeMn (10 nm)/Ta (3 nm) structure was produced. After the formation of the Si/alumina/Ta/NiFe/CoFe portion, the laminate was heated in a magnetic field of about 100 Oe identical in direction with the magnetic field used for film formation. After the sufficient cooling of the above portion, the Cu/CoFe/FeMn/Ta portion was formed. Magnetic fields different by 90 degrees from each other were respectively assigned to the NiFe (6 nm)/CoFe (1 nm) portion and CoFe (3 nm)/FeMn (10 nm) portion. FIG. 11 shows the resulting coercive forces and saturation magnetic fields of the free magnetic layer and MR ratios in relation to various heat treatment temperatures A.

As shown in FIG. 11, the coercive force and saturation temperature tended to slightly increase with the elevation of the heat treatment temperature A although such a tendency was not clearly accounted for. The MR ratio slowly decreased in accordance with the elevation of the heat treatment temperature A up to 250° C., but rather sharply fell at temperatures above 150° C.

A sample having the same structure as the above film was heated at 270° C. (heat treatment temperature B) for 5 hours in a magnetic field of 500 Oe parallel to the magnetic field used to form the CoFe/FeMn layer. FIG. 12 shows the resulting coercive forces and saturation magnetic fields of the free magnetic layer of the sample and MR ratios. As shown, at temperatures higher than 150° C. inclusive, the coercive force and saturation magnetic field decreased and increased, respectively. It will be seen that at temperatures above 150° C. the rotation of the free magnetic layer in the direction of anisotropy and ascribable to the Si layer/alumina layer can be reduced.

As also shown in FIG. 11, the lower limit of the heat treatment temperature A capable of reducing the rotation of the free magnetic layer was higher when the alumina layer was present than when it was absent; the diffusion of Si from the Si layer to the Ta/NiFe/CoFe layer was slowed down.

An MR effect film with a Cu (2.7 nm)/CoFe (3 nm)/FeMn (10 nm)/Ta (3 nm) structure was produced. Specifically, the Si/alumina/Ta/NiFe/CoFe portion was formed at a substrate temperature of 250° C. in a magnetic field of about 100 Oe and then sufficiently cooled off. Subsequently, the Cu/CoFe/FeMn/Ta portion was formed. In this case, the heat treatment temperature A was 250° C. Magnetic fields different by 90 degrees from each other were respectively assigned to the NiFe (6 nm)/CoFe (1 nm) portion and CoFe (3 nm)/FeMn (10 nm) portion. The coercive forces and saturation magnetic fields of the free magnetic layer are listed in FIG. 13 in relation to various thicknesses of the alumina layer. As shown, the coercive force and saturation magnetic field of the free magnetic layer and MR ratio are little dependent on the thickness of the alumina layer.

A sample identical in structure with the above sample was heated at 270° C. (heat treatment temperature β) for 5 hours in a magnetic field of 500 Oe parallel to the magnetic field used to form the CoFe/FeMn layer. FIG. 14 shows the resulting coercive forces and saturation magnetic fields of the free magnetic layer and MR ratios. As shown, the coercive force and saturation magnetic field increased and decreased, respectively, with an increase in the thickness of the alumina layer which played the role of a diffusion control layer. Presumably, the diffusion of Si from the Si layer to the Ta under layer and to the NiFe/CoFe layer via the alumina layer was greater in amount when the alumina layer was thinner, enhancing the thermal stability of the NiFe/CoFe layer as to induced magnetic anisotropy. The MR ratio decreased with an increase in the thickness of the alumina layer. This is presumably because a thinner alumina layer results in excessive diffusion of Si to the NiFe/CoFe layer and therefore in a decrease in MR ratio at the interface between CoFe and Cu.

An MR element with a glass substrate/Si (10 nm)/diffusion control layer (10 nm)/Ta (3 nm)/NiFe (6 nm)/CoFe (1 nm)/Cu (2.7 nm)CoFe (3 nm)/FeMn (10 nm)/Ta (3 nm) was produced. Specifically, the Si/alumina/Ta/NiFe/CoFe portion was formed with the substrate being heated at 250° C. in a magnetic field of about 100 Oe. After the sufficient cooling of this portion, the Cu/CoFe/FeMnTa portion was formed. The heat treatment temperature A was selected to be 250° C. Magnetic fields different by 90 degrees from each other were respectively assigned to the NiFe (6 nm)/CoFe (1 nm) portion and CoFe (3 nm)/FeMn (10 nm) portion.

FIG. 15 shows the resulting coercive forces and saturation magnetic fields of the free magnetic layer and MR ratios in relation to various kinds of diffusion control layers. As shown, the coercive force and saturation magnetic field of the above sample remained substantially constant without regard to the kind of the diffusion control layer.

A sample identical in structure with the above sample was heated at 270° C. (heat treatment temperature β) for 5 hours in a magnetic field parallel to the magnetic field used to form the CoFe/FeMn layer. FIG. 16 shows the resulting coercive forces and saturation magnetic fields of the free magnetic layer and MR ratios. As shown, the coercive force and saturation magnetic field remain substantially constant without regard to the kind of the diffusion control layer. This indicates that the anisotropy of the free magnetic layer was fixed in the direction occurred just after the film formation, and that the 270° C. (heat treatment temperature β) 5 hours heat treatment effected in the magnetic field of 500 Oe did not cause the anisotropy to rotate.

The above condition is presumably because Si reached the Ta under layer via the diffusion control layer. However, the MR ratio was scattered in the range of from 4.9% to 6.2%. This is presumably because the amount of Si reached the interface between the free magnetic layer and the nonmagnetic layer was dependent on the kind of the diffusion control layer.

An MR effect film with a Ta (3 nm)/NiFe (6 nm)/CoFe (1 nm)/Cu (2.7 nm)/CoFe (3 nm) structure directly formed on a glass substrate and an MR effect film with the same structure, but formed via an Si (10 nm)/alumina (1 nm) layer, were produced. Specifically, to form the Ta/NiFe/CoFe layer, the substrate was heated at 250° C. in a magnetic field of about 100 Oe. After the sufficient cooling of this layer, the Cu/CoFe/FeMn/Ta layer was formed. Magnetic fields different by 90 degrees from each other were respectively applied to the NiFe (6 nm)/CoFe (1 nm)/Cu (2.7 nm) portion and CoFe (3 nm)/FeMn (10 nm) portion. The resulting MR film was heated at the heat treatment temperature β in a magnetic field of 500 Oe parallel to the magnetic field used to form the CoFe/FeMn layer.

The temperature and duration of heat treatment for fixing the magnetization of the fixed layer depend on the kind of the fixing layer. Therefore, as shown in FIGS. 17 and 18, the heat treatment temperature β and duration thereof were varied in accordance with the kind of the fixing layer. The heat treatment may be needless or the heat treatment temperature may be low, depending on the kind of the fixing layer. However, for both of the two different configuration, heat treatment was effected at 230° C. for 3 hours or more for the formation of the MR effect film on a head. The resulting coercive forces and saturation magnetic fields of the free magnetic layers and MR ratios are shown in FIGS. 17 and 18.

As FIG. 17 indicates, the free magnetic layer had a coercive force greater than 1.5 Oe without regard to the presence/absence of the Si/alumina layer. This is presumably because the heat treatment at the temperature β caused an induced magnetic anisotropy applied to the free magnetic layer at the time of film formation to bend in the direction of the magnetic field for heat treatment. As FIG. 18 indicates, as for all of the different kinds of fixing layers, the coercive force of the free magnetic layer is smaller when the Si/alumina layer is present than when it is absent. This suggests that Si was effectively diffuses in the NiFe/CoFe layer. As for some materials including CoCr, the free magnetic layer has a coercive force as high as 1.8 Oe to 2.4 Oe. This is presumably ascribable to some cause other than the rotation of the anistropy because the saturation magnetic field of the free magnetic field is also high.

Hereinafter will be described Examples of the present invention applied to the shield type devices and each effecting particular heat treatment, together with the results of evaluation as magnetic heads.

EXAMPLE 1

A shield type device having the configuration shown in FIG. 1 was produced and included an NiFe lower shield layer and an alumina lower gap layer. For an MR effect film, use was made of an Si (10 nm)/alumina (10 nm)/Ta (3 nm)/Ni$_{\beta2}$Fe$_{18}$ (4 nm)Co$_{90}$Fe$_{10}$ (1 nm)/Cu (2.7 nm)/Co$_{90}$Fe$_{10}$ (2 nm)/Ni$_{\beta2}$Fe$_{18}$ (1 nm)/Ni$_{45}$Mn$_{54}$ (30 nm)/Ta (3 nm) structure. The Ta/NiFe/CoFe layer was formed at the substrate temperature of 250° C. in a magnetic field of 100 Oe. The other layers were formed without heating the substrate. After the formation of the MR effect film, the film was heated at 270° C. for 5 hours in a magnetic field of 500 Oe perpendicular to the above magnetic field.

The MR effect film was patterned in the size of 1×1 μm by a PR step to produce an MR effect element. A CoCrPt and an Mo lower electrode layer were laminated on the MR effect element in such a manner as to contact the edges of the element. An upper gap layer and an upper shield layer were implemented by alumina and NiFe, respectively.

The above head was provided with the configuration of FIG. 3, subjected to slider machining, and then used to record and reproduce data from a CoCrTa recording medium. The recording medium had a write track width of 1.5 m, a write gap of 0.2 m, a read track width of 1.0 m, and a read gap of 0.21 m. As for the write head, a photoresist curing step for forming a coil portion was affected at 250° C. for 2 hours.

As a result of the photoresist curing step, the magnetization direction of the fixed layer and that of the fixing layer expected to be oriented in the direction of height of the device rotated and prevented the function of a spin valve from being attained. To achieve the function of a spin valve, after the formation of the read head portion and write head portion, the above structure was heated at 200° C. for 1 hour in a magnetic field of 500 Oe for magnetization. The resulting magnetization curve showed little rotation of the easy axis of the free magnetic layer in the direction of magnetization. The recording medium had a coercive force of 2.5 kOe, and the reproduction output was measured by varying the length of a record mark.

The above measurement showed that the mark length halving the reproduction output was 154 kFIC, that the reproduction output (peak-to-peak) was 1.7 mV, that an S/N (Signal-to-Noise) ratio was 27 dB, that the error rate was less than $10^{-6}$ inclusive, that no noise occurred, and that the waveform was desirable. An environment test effected at 80° C. for 2,500 hours with 500 Oe did not cause the above error rate to change. Further, a current feed test effected with a current density of $2\times10^7$A/cm$^2$ in an environment of 80° C. did not cause the resistance or the MR ratio to change up to 1,000 hours.

EXAMPLE 2

A shield type device having the configuration shown in FIG. 1 was produced and included an NiFe lower shield layer and an alumina lower gap layer. For an MR effect film, use was made of an Si (10 nm)/alumina (10 nm)/Ta (3 nm)/Ni$_{\beta2}$Fe$_{18}$ (4 nm)/Co$_{90}$Fe$_{10}$ (1 nm)/Cu (2.7 nm)/Co$_{90}$Fe$_{10}$ (2 nm)/Ni$_{62}$Fe$_{18}$ (1 nm)/Pt$_{48}$Mn$_{52}$ (30 nm)/Ta (3 nm) structure. The Ta/NiFe/CoFe layer was formed at the substrate temperature of 250° C. in a magnetic field of 100 Oe. The other layers were formed without heating the substrate. After the formation of the MR effect film, the film was heated at 250° C. for 5 hours in a magnetic field of 500 Oe perpendicular to the above magnetic field.

The MR effect film was patterned in the size of 1×1 μm by a PR step to produce an MR effect element. A CoCrPt and an M lower electrode layer were laminated on the MR film in such a manner as to contact the edges of the film. An upper gap layer and an upper shield layer were implemented by alumina and NiFe, respectively.

The above head was provided with the configuration of FIG. 3, subjected to slider machining, and then used to record and reproduce data from a CoCrTa recording medium. The recording medium had a write track width of 1.5 m, a write gap of 0.2 m, a read track width of 1.0 m, and a read gap of 0.21 m. As for the write head, a photoresist curing step for forming a coil portion was effected at 250° C. for 2 hours.

As a result of the photoresist curing step, the magnetization direction of the fixes layer and that of the fixing layer expected to be oriented in the direction of height of the device rotated and prevented the function of a spin valve from being attained. To achieve the function of a spin valve, after the formation of the read head portion and write head portion, the above structure was heated at 200° C. for 1 hour in a magnetic field of 500 Oe for magnetization. The resulting magnetization curve showed little rotation of the easy axis of the free magnetic layer in the direction of magnetization. The recording medium had a coercive force of 2.5 kOe, and the reproduction output was measured by varying the length of a record mark.

The above measurement showed that the mark length halving the reproduction output was 150 kFCI, that the reproduction output (peak-to-peak) was 1.8 mV, that an S/N ratio was 26.9 dB, that the error rate was less than $10^{-6}$ inclusive, that no noise occurred, and that the waveform was desirable. An environment test effected at 80° C. for 2,500 hours with 500 Oe did not cause the above error rate to change. Further, a current feed test effected with a current density of $2 \times 10^7$ A/cm$^2$ in an environment of 80° C. did not cause the resistance or the MR ratio to change up to 1,000 hours.

EXAMPLE 3

A shield type device having the configuration shown in FIG. 1 was produced and included an NiFe lower shield layer and an alumina lower gap layer. For an MR effect film, use was made of an Si (10 nm)/alumina (10 nm)/Ta (3 nm)/Ni$_{82}$Fe$_{18}$ (4 nm)/Co$_{90}$Fe$_{10}$ (1 nm)/Cu (2.7 nm)/Co$_{90}$Fe$_{10}$ (2 nm)/Ni$_{82}$Fe$_{18}$ (1 nm)/IR$_{24}$Mn$_{78}$ (10 nm)/Ta (3 nm) structure. The Ta/NiFe/CoFe layer was formed at the substrate temperature of 270° C. in a magnetic field of 100 Oe. The other layers were formed without heating the substrate. After the formation of the MR effect film, the film was heated at 250° C. for 5 hours in a magnetic field of 500 Oe perpendicular to the above magnetic field.

The MR effect film was patterned in the size of 1×1 μm by a PR step to produce an MR effect element. A CoCrPt and an Mo lower electrode layer were laminated on the MR effect element in such a manner as to contact the edges of the element. An upper gap layer and an upper shield layer were implemented by alumina and NiFe, respectively.

The above head was provided with the configuration of FIG. 3, subjected to slider machining, and then used to record and reproduce data from a CoCrTa recording medium. The recording medium had a write track width of 1.5 m, a write gap of 0.2 m, a read track width of 1.0 m, and a read gap of 0.21 m. As for the write head, a photoresist curing step for forming a coil portion was effected at 250° C. for 2 hours.

As a result of the photoresist curing step, the magnetization direction of the fixed layer and that of the fixing layer expected to be oriented in the direction of height of the device rotated and prevented the function of a spin valve from being attained. To achieve the function of a spin valve, after the formation of the read head portion and write head portion, the above structure was heated at 200° C. for 1 hour in a magnetic field of 500 Oe for magnetization. The resulting magnetization curve showed little rotation of the easy axis of the free magnet layer in the direction of magnetization. The recording medium had a coercive force of 2.5 kOe, and the reproduction output was measured by varying the length of a record mark.

The above measurement showed that the mark length halving the reproduction output was 146 kFCI, that the reproduction output (peak-to-peak) was 1.7 mV, that an S/N ratio was 26.5 dB, that the error rate was less than $10^{-6}$ inclusive, that no noise occurred, and that the waveform was desirable. An environment test effected at 80° C. for 2,500 hours with 500 Oe did not cause the above error rate to change. Further, a current feed test effected with a current density of $2 \times 10^7$ A/cm$^2$ in an environment of 80° C. did not cause the resistance or the MR ratio to change up to 1,000 hours.

EXAMPLE 4

A shield type device having the configuration shown in FIG. 1 was produced and included an NiFe lower shield layer and an alumina lower gap layer. For an MR effect film, use was made of an Si (10 nm)/CiO$_2$ (10 nm)/Ta (3 nm)/Ni$_{\beta 2}$Fe$_{18}$ and (4 nm)/Co$_{90}$Fe$_{10}$ (1 nm)/Cu (2.7 nm)/Co$_{90}$Fe$_{10}$ (2 nm)/Ni$_{\beta 2}$Fe$_{16}$ (1 nm)/Fe$_2$O$_3$ (1 nm)/NiO (30 nm)/Ta (3 nm) structure. In this case, the substrate was not heated at all. A magnetic field for film formation was selected to be 100 Oe. After the film formation, the film was heated at 270° C. for 5 hours in a magnetic field of 500 Oe perpendicular to the above magnetic field.

The MR effect film was patterned in the size of 1×1 μm by a PR step to produce an MR effect element. A CoCrPt and an Mo lower electrode layer were laminated on the MR effect element in such a manner as to contact the edges of the element. An upper gap layer and an upper shield layer were implemented by alumina and NiFe, respectively.

The above head was provided with the configuration of FIG. 3, subjected to slider machining, and then used to record and reproduce data from a CoCrTa recording medium. The recording medium had a write track width of 1.5 m, a write gap of 0.2 m, a read track width of 1.0 m, and a read gap of 0.21 m. As for the write head, a photoresist curing step for forming a coil portion was effected at 250° C. for 2 hours.

As a result of the photoresist curing step, the magnetization direction of the fixed layer and that of the fixing layer expected to be oriented in the direction of height of the device rotated and prevented the function of a spin valve from being attained. To achieve the function of a spin valve, after the formation of the read head portion and write head portion, the above structure was heated at 200° C. for 1 hour in a magnetic field of 500 Oe for magnetization. The resulting magnetization curve showed little rotation of the easy axis of the free magnet layer in the direction of magnetization. The recording medium had a coercive force of 2.5 kOe, and the reproduction output was measured by varying the length of a record mark.

The above measurement showed that the mark length halving the reproduction output was 160 kFCI, that the reproduction output (peak-to-peak) was 2.1 mV, that an S/N ratio was 28.5 dB, that the error rate was less than $10^{-6}$ inclusive, that no noise occurred, and that the waveform was desirable. An environment test effected at 80° C. for 2,500 hours with 500 Oe did not cause the above error rate to change. Further, a current feed test effected with a current density of $2 \times 10^7$ A/cm$^2$ in an environment of 80° C. did not cause the resistance or the MR ratio to change up to 1,000 hours.

EXAMPLE 5

A shield type device having the configuration shown in FIG. 1 was produced and included an NiFe lower shield layer and an alumina lower gap layer. For an MR effect film, use was made of an Si (10 nm)/SiO$_2$ (10 nm)/Ta (3 nm)/Ni$_{\beta 2}$Fe$_{18}$ (4 nm)/Co$_{90}$Fe$_{10}$ (1 nm)/Cu (2.7 nm)/Co$_{90}$Fe$_{10}$ (2 nm)/Ni$_{\beta 2}$Fe$_{18}$ (1 nm)/CoO (1 nm)/NiO (30 nm)/Ta (3 nm) structure. The substrate was not heated at all during film formation. A magnetic field for film formation was selected to be 100 Oe. After the film formation, the film was heated at 270° C. for 5 hours in a magnetic field of 500 Oe perpendicular to the above magnetic field.

The MR effect film was patterned in the size of 1×1 μm by a PR step to produce an MR effect element. A CoCrPt and an Mo lower electrode layer were laminated on the MR effect element in such a manner as to contact the edges of the element. An upper gap layer and an upper shield layer were implemented by alumina and NiFe, respectively.

The above head was provided with the configuration of FIG. 3, subjected to slider machining, and then used to record and reproduce data from a CoCrTa recording medium. The recording medium had a write track width of 1.5 m, a write gap of 0.2 m, a read track width of 1.0 m, and a read gap of 0.21 m. As for the write head, a photoresist curing step for forming a coil portion was effected at 250° C. for 2 hours.

As a result of the photoresist curing step, the magnetization direction of the fixed layer and that of the fixing layer expected to be oriented in the direction of height of the device rotated and prevented the function of a spin valve from being attained. To achieve the function of a spin valve, after the formation of the read head portion and write head portion, the above structure was heated at 200° C. for 1 hour in a magnetic field of 500 Oe for magnetization. The resulting magnetization curve showed little rotation of the easy axis of the free magnetic layer in the direction of magnetization. The recording medium had a coercive force of 2.5 kOe, and the reproduction output was measured by varying the length of a record mark.

The above measurement showed that the mark length halving the reproduction output was 161 kFCI, that the reproduction output (peak-to-peak) was 2.0 mV, that an S/N ratio was 28.1 dB, that the error rate was less than $10^{-6}$ inclusive, that no noise occurred, and that the waveform was desirable. An environment test effected at 80° C. for 2,500 hours with 500 Oe did not cause the above error rate to change. Further, a current feed test effected with a current density of $2 \times 10^7$ A/cm$^2$ in an environment of 80° C. did not cause the resistance or the MR ratio to change up to 1,000 hours.

EXAMPLE 6

A shield type device having the configuration shown in FIG. 1 was produced and included an NiFe lower shield layer and an alumina lower gap layer. For an MR effect film, use was made of an Si (10 nm)/alumina (12 nm)/Ta (3 nm)/Ni$_{82}$Fe$_{16}$ (4 nm)/Co$_{90}$Fe$_{10}$ (1 nm)/Cu (2.7 nm)/Co$_{90}$Fe$_{10}$ (2 nm)Ni$_{82}$Fe$_{18}$ (1 nm)/Ni$_{46}$Mn$_{64}$ (30 nm/Ta (3 nm) structure. The Ta/NiFe/CoFe layer was formed with the substrate being heated at 250° C. while the other films were formed without the substrate being heated. A magnetic field for film formation was selected to be 100 Oe. After the film formation, the film was heated at 270° C. for 5 hours in a magnetic field of 500 Oe perpendicular to the above magnetic field.

The MR effect film was patterned in the size of 1×1 μm by a PR step to produce an MR effect element. A CoCrPt and an Mo lower electrode layer were laminated on the MR effect element in such a manner as to contact the edges of the element. An upper gap layer and an upper shield layer were implemented by alumina and NiFe, respectively.

The above head was provided with the configuration of FIG. 3, subjected to slider machining, and then used to record and reproduce data from a CoCrTa recording medium. The recording medium had a write track width of 1.5 m, a write gap of 0.2 m, a read track width of 1.0 m, and a read gap of 0.21 m. As for the write head, a photoresist curing step for forming a coil portion was effected at 250° C. for 2 hours.

As a result of the photoresist curing step, the magnetization direction of the fixed layer and that of the fixing layer expected to be oriented in the direction of height of the device rotated and prevented the function of a spin valve from being attained. To achieve the function of a spin valve, after the formation of the read head portion and write head portion, the above structure was heated to 200° C. for 1 hour in a magnetic field of 500 Oe for magnetization. The resulting magnetization curve showed little rotation of the easy axis of the free magnetic layer in the direction of magnetization. The recording medium had a coercive force of 2.5 kOe, and the reproduction output was measured by varying the length of a record mark.

The above measurement showed that the mark length halving the reproduction output was 157 kFCI, that the reproduction output (peak-to-peak) was 1.8 mV, that an S/N ratio was 26.9 dB, that the error rate was less than $10^{-6}$ inclusive, that no noise occurred, and that the waveform was desirable. An environment test effected at 80° C. for 2,500 hours with 500 Oe did not cause the above error rate to change. Further, a current feed test effected with a current density of $2 \times 10^7$ A/cm$^2$ in an environment of 80° C. did not cause the resistance or the MR ratio to change up to 1,000 hours.

EXAMPLE 7

A shield type device having the configuration shown in FIG. 1 was produced and included an NiFe lower shield layer and an alumina lower gap layer. For an MR effect film, use was made of an Si (10 nm)/SiO$_2$ (10 nm)/Ta (3 nm)/Ni$_{82}$Fe$_{18}$ (4 nm)/Co$_{90}$Fe$_{10}$ (1 nm)/Cu (2.7 nm)/Co$_{90}$Fe$_{10}$ (2 nm)/Ni$_{82}$Fe$_{18}$ (1 nm)/Ni$_{40}$Mn$_{64}$ (30 nm)/Ta (3 nm) structure. The Ta/NiFe/CoFe layer was formed with the substrate being heated at 250° C. while the other films were formed without the substrate being heated. A magnetic field for film formation was selected to be 100 Oe. After the film formation, the film was heated at 270° C. for 5 hours in a magnetic field of 500 Oe perpendicular to the above magnetic field.

The MR effect film was patterned in the size of 1×1 μm by a PR step to produce an MR effect element. A CoCrPt and an Mo lower electrode layer were laminated on the MR effect element in such a manner as to contact the edges of the element. An upper gap layer and an upper shield layer were implemented by alumina and NiFe, respectively.

The above head was provided with the configuration of FIG. 3, subjected to slider machining, and then used to record and reproduce data from a CoCrTa recording medium. The recording medium had a write track width of 1.5 m, a write gap of 0.2 m, a read track width of 1.0 m, and a read gap of 0.21 m. As for the write head, a photoresist curing step for forming a coil portion was effected at 250° C. for 2 hours.

As a result of the photoresist curing step, the magnetization direction of the fixed layer and that of the fixing layer expected to be oriented in the direction of height of the device rotated and prevented the function of a spin valve from being attained. To achieve the function of a spin valve, after the formation of the read head portion and write head portion, the above structure was heated at 200° C. for 1 hour in a magnetic field of 500 Oe for magnetization. The resulting magnetization curve showed little rotation of the easy axis of the free magnetic layer in the direction of magnetization. The recording medium had a coercive force of 2.5 kOe, and the reproduction output was measured by varying the length of a record mark.

The above measurement showed that the mark length halving the reproduction output was 159 kFCI, that the reproduction output (peak-to-peak) was 1.8 mV, that an S/N ratio was 26.8 dB, that the error rate was less than $10^{-6}$ inclusive, that no noise occurred, and that the waveform was desirable. An environment test effected at 80° C. for 2,500 hours with 500 Oe did not cause the above error rate to change. Further, a current feed test effected with a current density of $2\times10^7$ A/cm$^2$ in an environment of 80° C. did not cause the resistance or the MR ratio to change up to 1,000 hours.

EXAMPLE 8

A shield type device having the configuration shown in FIG. 1 was produced and included an NiFe lower shield layer and an alumina lower gap layer. For an MR effect film, use was made of an Si (10 nm)/tantalum oxide (13 nm)/Ta (3 nm)/Ni$_{82}$Fe$_{18}$ (4 nm)/Co$_{90}$Fe$_{10}$ (1 nm)/Cu (2.7 nm)/Co$_{90}$Fe$_{10}$ (2 nm)/Ni$_{82}$Fe$_{18}$ (1 nm)/Ni$_{46}$Mn$_{54}$ (30 nm)/Ta (3 nm) structure. The Ta/NiFe/CoFe layer was formed with the substrate being heated at 250° C. while the other films were formed without the substrate being heated. A magnetic field for film formation was selected to be 100 Oe. After the film formation, the film was heated at 270° C. for 5 hours in a magnetic field of 500 Oe perpendicular to the above magnetic field.

The MR effect film was patterned in the size of 1×1 μm by a PR step to produce an MR effect element. A CoCrPt and an Mo lower electrode layer were laminated on the MR effect element in such a manner as to contact the edges of the element. An upper gap layer and an upper shield layer were implemented by alumina and NiFe, respectively.

The above head was provided with the configuration of FIG. 3, subjected to slider machining, and then used to record and reproduce data from a CoCrTa recording medium. The recording medium had a write track width of 1.5 m, a write gap of 0.2 m, a read track width of 1. 0 m, and a read gap of 0.21 m. As for the write head, a photoresist curing step for forming a coil portion was effected at 250° C. for 2 hours.

As a result of the photoresist curing step, the magnetization direction of the fixed layer and that of the fixing layer expected to be oriented in the direction of height of the device rotated and prevented the function of a spin valve from being attained. To achieve the function of a spin valve, after the formation of the read head portion and write head portion, the above structure was heated at 200° C. for 1 hour in a magnetic field of 500 Oe for magnetization. The resulting magnetization curve showed little rotation of the easy axis of the free magnetic layer in the direction of magnetization. The recording medium had a coercive force of 2.5 kOe, and the reproduction output was measured by varying the length of a record mark.

The above measurement showed that the mark length halving the reproduction output was 157 kFCI, that the reproduction output (peak-to-peak) was 1.6 mV, that an S/N ratio was 26.5 dB, that the error rate was less than $10^{-6}$ inclusive, that no noise occurred, and that the waveform was desirable. An environment test effected at 80° C. for 2,500 hours with 500 Oe did not cause the above error rate to change. Further, a current feed test effected with a current density of $2\times10^7$ A/cm$^2$ in an environment of 80° C. did not cause the resistance or the MR ratio to change up to 1,000 hours.

EXAMPLE 9

A shield type device having the configuration shown in FIG. 1 was produced and included an NiFe lower shield layer and an alumina lower gap layer. For an MR effect film, use was made of an Si (10 nm)/aluminum nitride (8 nm)/Ta (3 nm)/Ni$_{82}$Fe$_{18}$ (4 nm)/Co$_{80}$Fe$_{10}$ (1 nm)/Cu (2.7 nm)/CO$_{90}$Fe$_{10}$ (2 nm)/Ni$_{82}$Fe$_{18}$ (1 nm)/Ni$_{48}$Mn$_{54}$ (30 nm)/Ta (3 nm) structure. The Ta/NiFe/CoFe layer was formed with the substrate being heated at 250° C. while the other films were formed without the substrate being heated. A magnetic field for film formation was selected to be 100 Oe. After the film formation, the film was heated at 270° C. for 5 hours in a magnetic field of 500 Oe perpendicular to the above magnetic field.

The MR effect film was patterned in the size of 1×1 μm by a PR step to produce an MR effect element. A CoCrPt and an Mo lower electrode layer were laminated on the MR effect element in such a manner as to contact the edges of the element. An upper gap layer and an upper shield layer were implemented by alumina and NiFe, respectively.

The above head was provided with the configuration of FIG. 3, subjected to slider machining, and then used to record and reproduce data from a CoCrTa recording medium. The recording medium had a write track width of 1.5 m, a write gap of 0.2 m, a read track width of 1.0 m, and a read gap of 0.21 m. As for the write head, a photoresist curing step for forming a coil portion was effected at 250° C. for 2 hours.

As a result of the photoresist curing step, the magnetization direction of the fixed layer and that of the fixing layer expected to be oriented in the direction of height of the device rotated and prevented the function of a spin valve from being attained. To achieve the function of a spin valve, after the formation of the read head portion and write head portion, the above structure was heated at 200° C. for 1 hours in a magnetic field of 500 Oe for magnetization. The resulting magnetization curve showed little rotation of the easy axis of the free magnetic layer in the direction of magnetization. The recording medium had a coercive force of 2.5 kOe, and the reproduction output was measured by varying the length of a record mark.

The above measurement showed that the mark length halving the reproduction output was 158 kFCl, that the reproduction output (peak-to-peak) was 1.8 mV, that an S/N ratio was 26.8 dB, that the error rate was less than $10^{-6}$ inclusive, that no noise occurred, and that the waveform was desirable. An environment test effected at 80° C. for 2,500 hours with 500 Oe did not cause the above error rate to change. Further, a current feed test effected with a current density of $2\times10^7$ A/cm$^2$ in an environment of 80° C. did not cause the resistance or the MR ratio to change up to 1,000 hours.

EXAMPLE 10

A shield type device having the configuration shown in FIG. 1 was produced and included an NiFe lower shield layer and an alumina lower gap layer. For an MR effect film, use was made of an Si (10 nm)/silicon nitride (11 nm)/Ta (3 nm)/Ni$_{82}$Fe$_{18}$ (4 nm)/Co$_{80}$Fe$_{10}$ (1 nm)/Cu (2.7 nm)/Co$_{80}$Fe$_{10}$ (2 nm)/Ni$_{82}$Fe$_{18}$ (1 nm)/Ni$_{48}$Mn$_{54}$ (30 nm)/Ta (3 nm) structure. The Ta/NiFe/CoFe layer was formed with the substrate being heated at 250° C. while the other films were formed without the substrate being heated. A magnetic field for film formation was selected to be 100 Oe. After the film formation, the film was heated at 270° C. for 5 hours in a magnetic field of 500 Oe perpendicular to the above magnetic field.

The MR effect film was patterned in the size of 1×1 μm by a PR step to produce an MR effect element. A CoCrPt and an Mo lower electrode layer were laminated on the MR effect element in such a manner as to contact the edges of the element. An upper gap layer and an upper shield layer were implemented by alumina and NiFe, respectively.

The above head was provided with the configuration of FIG. 3, subjected to slider machining, and then used to record and reproduce data from a CoCrTa recording medium. The recording medium had a write track width of 1.5 m, a write gap of 0.2 m, a read track width of 1.0 m, and a read gap of 0.21 m. As for the write head, a photoresist curing step for forming a coil portion was effected at 250° C. for 2 hours.

As a result of the photoresist curing step, the magnetization direction of the fixed layer and that of the fixing layer expected to be oriented in the direction of height of the device rotated and prevented the function of a spin valve from being attained. To achieve the function of a spin valve, after the formation of the read head portion and write head portion, the above structure was heated at 200° C. for 1 hour in a magnetic field of 500 Oe for magnetization. The resulting magnetization curve showed little rotation of the easy axis of the free magnetic layer in the direction of magnetization. The recording medium had a coercive force of 2.5 kOe, and the reproduction output was measured by varying the length of a record mark.

The above measurement showed that the mark length halving the reproduction output was 156 kFCl, that the reproduction output (peak-to-peak) was 1.9 mV, that an S/N ratio was 26.7 dB, that the error rate was less than $10^{-6}$ inclusive, that no noise occurred, and that the waveform was desirable. An environment test effected at 80° C. for 2,500 hours with 500 Oe did not cause the above error rate to change. Further, a current feed test effected with a current density of $2\times10^7$ A/cm$^2$ in an environment of 80° C. did not cause the resistance or the MR ratio to change up to 1,000 hours.

EXAMPLE 11

A shield type device having the configuration shown in FIG. 1 was produced and included an NiFe lower shield layer and an alumina lower gap layer. For an MR effect film, use was made of an Si (10 nm)/alumina (11 nm)/Ta (3 nm)/Ni$_{82}$Fe$_{18}$ (4 nm)/Co$_{80}$Fe$_{10}$ (1 nm)/Cu (2.7 nm)/Co$_{90}$Fe$_{10}$ (2 nm)/Ni$_{82}$Fe$_{18}$ (1 nm)/Ni$_{48}$Mn$_{54}$ (30 nm)/Ta (3 nm) structure. After the formation of the Ta/NiFe/CoFe layer, the laminate was heated at 250° C. for 5 hours, sufficiently cooled off, and then formed with the other layers. A magnetic field for film formation was selected to be 100 Oe. After the film formation, the film was heated at 270° C. for 5 hours in a magnetic field of 500 Oe perpendicular to the above magnetic field.

The MR effect film was patterned in the size of 1×1 μm by a PR step to produce an MR effect element. A CoCrPt and an Mo lower electrode layer were laminated on the MR effect element in such a manner as to contact the edges of the element. An upper gap layer and an upper shield layer were implemented by alumina and NiFe, respectively.

The above head was provided with the configuration of FIG. 3, subjected to slider machining, and then used to record and reproduce data from a CoCrTa recording medium. The recording medium had a write track width of 1.5 m, a write gap of 0.2 m, a read track width of 1.0 m, and a read gap of 0.21 m. As for the write head, a photoresist curing step for forming a coil portion was effected at 250° C. for 2 hours.

As a result of the photoresist curing step, the magnetization direction of the fixed layer and that of the fixing layer expected to be oriented in the direction of height of the device rotated and prevented the function of a spin valve from being attained. To achieve the function of a spin valve, after the formation of the read head portion and write head portion, the above structure was heated at 200° C. for 1 hour in a magnetic field of 500 Oe for magnetization. The resulting magnetization curve showed little rotation of the easy axis of the free magnetic layer in the direction of magnetization. The recording medium had a coercive force of 2.5 kOe, and the reproduction output was measured by varying the length of a record mark.

The above measurement showed that the mark length halving the reproduction output was 156 kFCl, that the reproduction output (peak-to-peak) was 1.8 mV, that an S/N ratio was 26.6 dB, that the error rate was less than $10^{-6}$ inclusive, that no noise occurred, and that the waveform was desirable. An environment test effected at 80° C. for 2,500 hours with 500 Oe did not cause the above error rate to change. Further, a current feed test effected with a current density of $2\times10^7$ A/cm$^2$ in an environment of 80° C. did not cause the resistance or the MR ratio to change up to 1,000 hours.

EXAMPLE 12

A shield type device having the configuration shown in FIG. 2 was produced and included an NiFe lower shield layer and an alumina lower gap layer. For an MR effect film, use was made of an Si (10 nm)/alumina (11 nm)/Ta (3 nm)/Ni$_{82}$Fe$_{18}$ (4 nm)/Co$_{80}$Fe$_{10}$ (1 nm)/Cu (2.7 nm)/Co$_{80}$Fe$_{10}$ (2 nm)/Ni$_{82}$Fe$_{18}$ (1 nm)/Ni$_{48}$Mn$_{54}$ (30 nm)/Ta (3 nm) structure. After the formation of the Ta/NiFe/CoFe layer, the laminate was heated at 250° C. for 5 hours, sufficiently cooled off, and then formed with the other layers. A magnetic field for film formation was selected to be 100 Oe. After the film formation, the film was heated at 270° C. for 5 hours in a magnetic field of 500 Oe perpendicular to the above magnetic field.

The MR effect film was patterned in the size of 1×1 μm by a PR step to produce an MR effect element. A CoCrPt and an Mo lower electrode layer were laminated on the MR effect element in such a manner as to contact the edges of the film. An upper gap layer and an upper shield layer were implemented by alumina and NiFe, respectively.

The above head was provided with the configuration of FIG. 3, subjected to slider machining, and then used to record and reproduce data from a CoCrTa recording medium. The recording medium had a write track width of 1.5 m, a write gap of 0.2 m, a read track width of 1.0 m, and a read gap of 0.21 m. As for the write head, a photoresist curing step for forming a coil portion was effected at 250° C. for 2 hours.

As a result of the photoresist curing step, the magnetization direction of the fixed layer and that of the fixing layer expected to be oriented in the direction of height of the device rotated and prevented the function of a spin valve from being attained. To achieve the function of a spin valve, after the formation of the read head portion and write head portion, the above structure was heated at 200° C. for 1 hour in a magnetic field of 500 Oe for magnetization. The resulting magnetization curve showed little rotation of the easy axis of the free magnetic layer in the direction of magnetization. The recording medium had a coercive force of 2.5 kOe, and the reproduction output was measured by varying the length of a record mark.

The above measurement showed that the mark length halving the reproduction output was 156 kFCl, that the reproduction output (peak-to-peak) was 1.9 mV, that an S/N ratio was 26.8 dB, that the error rate was less than $10^{-6}$ inclusive, that no noise occurred, and that the waveform was desirable. An environment test effected at 80° C. for 2,500 hours with 500 Oe did not cause the above error rate to change. Further, a current feed test effected with a current density of $2\times10^7$ A/cm$^2$ in an environment of 80° C. did not cause the resistance or the MR ratio to change up to 1,000 hours.

EXAMPLE 13

A shield type device having the configuration shown in FIG. 1 was produced and included an CoZrTa lower shield layer and an alumina lower gap layer. For an MR effect film, use was made of an Si (10 nm)/alumina (10 nm)/Ta (3 nm)/Ni$_{82}$Fe$_{18}$ (4 nm)/Co$_{80}$Fe$_{10}$ (1 nm)/Cu (2.7 nm)/Co$_{80}$Fe$_{10}$ (2 nm)/Ni$_{82}$Fe$_{18}$ (1 nm)/Ni$_{48}$Mn$_{54}$ (30 nm)/Ta (3 nm) structure. After the formation of the Ta/NiFe/CoFe layer, the laminate was heated at 250° C. for 5 hours, sufficiently cooled off, and then formed with the other layers. A magnetic field for film formation was selected to be 100 Oe. After the film formation, the film was heated at 270° C. for 5 hours in a magnetic field of 500 Oe perpendicular to the above magnetic field.

The MR effect film was patterned in the size of 1×1 μm by a PR step to produce an MR effect element. A CoCrPt and an Mo lower electrode layer were laminated on the MR effect element in such a manner as to contact the edges of the element. An upper gap layer and an upper shield layer were implemented by alumina and CoZrTa, respectively.

The above head was provided with the configuration of FIG. 3, subjected to slider machining, and then used to record and reproduce data from a CoCrTa recording medium. The recording medium had a write track width of 1.5 m, a write gap of 0.2 m, a read track width of 1.0 m, and a read gap of 0.21 m. As for the write head, a photoresist curing step for forming a coil portion was effected at 250° C. for 2 hours.

As a result of the photoresist curing step, the magnetization direction of the fixed layer and that of the fixing layer expected to be oriented in the direction of height of the device rotated and prevented the function of a spin valve from being attained. To achieve the function of a spin valve, after the formation of the read head portion and write head portion, the above structure was heated at 200° C. for 1 hour in a magnetic field of 500 Oe for magnetization. The resulting magnetization curve showed little rotation of the easy axis of the free magnetic layer in the direction of magnetization. The recording medium had a coercive force of 2.5 kOe, and the reproduction output was measured by varying the length of a record mark.

The above measurement showed that the mark length halving the reproduction output was 156 kFCl, that the reproduction output (peak-to-peak) was 1.9 mV, that an S/N ratio was 26.8 dB, that the error rate was less than $10^{-6}$ inclusive, that no noise occurred, and that the waveform was desirable. An environment test effected at 80° C. for 2,500 hours with 500 Oe did not cause the above error rate to change. Further, a current feed test effected with a current density of $2\times10^7$ A/cm$^2$ in an environment of 80° C. did not cause the resistance or the MR ratio to change up to 1,000 hours.

An experimental magnetic disk drive implemented by the present invention is as follows. Three recording media are amounted on a base included in the disk drive. A head drive circuit, a signal processing circuit and an input/output interface are mounted on the rear of the base. The disk drive is connected to the outside by a third-two bits bus line.

A single magnetic head faces one surface of each recording medium. A rotary actuator for driving such heads, a circuit for driving and controlling the rotary actuator, and a spindle motor for causing the recording media to spin are mounted on the disk drive. Each recording medium has a diameter of 46 nm and is capable of recording data over its area between the diameter of 10 mm and the diameter of 40 mm. The disk drive uses a buried servo system for positioning each head and therefore implements a high density configuration due to the absence of a servo surface.

The above disk drive is directly connectable to a small size computer as an outside storage. The input/output interface includes a cache memory and adapts itself to a bus line whose transfer rate ranges from 5 megabytes to 20 megabytes per second. Further, a plurality of such disk drives may be connected together to constitute a large capacity disk drive if an outside controller (disk controller) is available.

In summary, it will be seen that the present invention provides an MR effect element including a free magnetic layer whose coercive force is small, and having an R—H loop involving a minimum of hysteresis, a method of producing such an MR effect element, and an MR sensor, an MR sensing system and a magnetic storage system each using the above MR effect element.

Various modifications will become possible for those skilled in the art after receiving the teachings of the present disclosure without departing from the scope thereof.

What is claimed is:

1. A magnetoresistive (MR) effect element including a unit comprising:
   a Si layer;
   a metal lower layer formed on said Si layer;
   a free magnetic layer formed on said metal lower layer;
   a nonmagnetic layer formed on said free magnetic layer;
   a fixed layer formed on said nonmagnetic layer, said fixed layer being fixed relative to said free magnetic layer; and
   a magnetic fixing layer formed on said fixed layer.

2. A MR effect element including a unit comprising:
   a Si layer;
   a diffusion control layer formed on said Si layer;
   a metal lower layer formed on said Si layer;
   a free magnetic layer formed on said metal lower layer;
   a nonmagnetic layer formed on said free magnetic layer;
   a fixed layer formed on said nonmagnetic layer, said fixed layer being fixed relative to said free magnetic layer; and
   a magnetic fixing layer formed on said fixed layer.

3. An MR effect element as claimed in claim 2, wherein said diffusion control layer comprises a material selected from the group consisting of Ta, Hf, Zr, W, Cr, Ti, Mo, Pt, Ni, Ir, Cu, Ag, Co, Zn, Ru, Rh, Re, Au, Os, Pd, Nb and V.

4. An MR effect element as claimed in claim 2, wherein said diffusion control layer comprises one of a mixture of an oxide and a nitride both selected from the group consisting of Si, Ta, Al, Ti, V, Cr, Mn, Hf, Zr, W, Mo, Ni and Zn and a mixture of said oxide and said nitride.

5. An MR effect element as claimed in claim 4, wherein said diffusion control layer further comprises one of a mixture and a laminate of an oxide and a nitride both selected from the group consisting of Si, Ta, Al, Ti, V, Cr, Mn, Hf, Zr, W, Mo, Ni, and Zn.

6. An MR effect sensor comprising:
   a lower shield pattern formed on a substrate;
   a lower gap formed on said lower shield pattern;
   a MR effect element having an MR effect element pattern formed on said lower gap, said MR effect element pattern having edges;

longitudinal biasing layer patterns formed on said lower gap, said longitudinal biasing layer patterns having edges parts of which edges contacting the edges of said MR effect element pattern;

electrode patterns formed on said lower gap, said electrode patterns having edges parts of which edges contacting the edges of said MR effect element pattern;

an upper gap formed on said MR effect element pattern, on said longitudinal biasing patterns, and said electrode patterns;

an upper shield pattern formed on said upper gap; and a unit included in said MR effect element which includes an Si layer, a metal lower layer formed on said Si layer, a free magnetic layer formed on said metal lower layer, a non magnetic layer formed on said free magnetic layer; a fixed layer formed on said nonmagnetic layer, and a magnetic fixing layer formed on said fixed layer, said fixed layer being fixed relative to said free magnetic layer.

7. An MR effect sensor comprising:

a lower shield pattern formed on a substrate;

a lower gap formed on said lower shield pattern;

a MR effect element having an MR effect element pattern formed on said lower gap, said MR effect element pattern having edges;

longitudinal biasing layer patterns formed on said lower gap, said longitudinal biasing laver patterns having edges parts of which edges contacting the edges of the MR effect element pattern;

electrode patterns formed on said lower gap, said electrode patterns having edges parts of which edges contacting the edges of the MR effect element pattern;

an upper gap formed on said MR effect element pattern, on said longitudinal biasing layer patterns, and said electrode patterns;

an upper shield pattern formed on said upper gap; and a unit included in said MR effect element which includes an Si layer, a diffusion control layer formed on said Si layer, a metal lower layer formed on said Si layer, a free magnetic layer formed on said metal lower layer, a nonmagnetic layer formed on said free magnetic layer, a fixed layer formed on said free magnetic layer, and a magnetic fixing layer formed on said fixed layer, said fixed layer being fixed relative to said free magnetic layer.

8. An MR effect sensor as claimed in claim 7, wherein said diffusion control layer comprises at least one element selected from the group consisting of Ta, Hf, Zr, W, Cr, Ti, Mo, Pt, Ni, Ir, Cu, Ag, Co, Zn, Ru, Rh, Re, Au, Os, Pd, Nb and V.

9. An MR effect element as claimed in claim 7, wherein said diffusion control layer comprises one of an oxide and a nitride both selected from the group consisting of Si, Ta, Al, Ti, V, Cr, Mn, Hf, Zr, W, Mo, Ni and Zn and a mixture of said oxide and said nitride.

10. An MR effect element as claimed in claim 7, wherein said diffusion control layer comprises one of a mixture and a laminate of an oxide and a nitride both selected from the group consisting of Si, Ta, Al, Ti, V, Cr, Mn, Hf, Zr, W, Mo, Ni, and Zn.

11. An MR effect sensor comprising:

a lower shield pattern formed on a substrate;

a lower gap formed on said lower shield pattern;

a MR effect element having an MR effect element pattern formed on said lower gap, said MR effect element pattern having edges;

longitudinal biasing Layer patterns formed on said lower gap, said longitudinal biasing layer patterns having edges parts of which edges contacting the edges of the MR effect element pattern;

electrode patterns formed on said lower gap, parts of said electrode patterns are formed on said MR effect element pattern;

an upper gap formed on said MR effect element pattern, on said longitudinal biasing patterns, and said electrode patterns;

an upper shield pattern formed on said upper gap; and a unit included in said MR effect element which includes an Si layer, a metal lower layer formed on said Si layer, a free magnetic layer formed on said metal lower layer, a nonmagnetic layer formed on said free magnetic layer, a fixed layer formed on said nonmagnetic layer, and a magnetic fixing layer formed on said fixed layer, said fixed layer being fixed relative to said free magnetic layer.

12. An MR effect sensor comprising:

a lower shield pattern formed on a substrate;

a lower gap formed on said lower shield pattern;

a MR effect element having an MR effect element pattern formed on said lower gap;

longitudinal biasing layer patterns formed on said lower gap, parts of which are formed on said MR effect element pattern;

electrode patterns formed on said lower gap, parts of which are formed on said MR effect element pattern;

an upper gap formed on said MR effect element pattern, on said longitudinal biasing patterns, and said electrode patterns;

an upper shield pattern formed on said upper gap;

a unit included in said MR effect element which includes an Si layer, a diffusion control layer formed on said Si layer, a metal lower layer formed on said Si layer, a free magnetic layer formed on said metal lower layer, a nonmagnetic layer formed on said free magnetic layer, a fixed layer formed on said free magnetic layer, and a magnetic fixing layer formed on said fixing layer, said fixed layer being fixed relative to said free magnetic layer.

13. An MR effect sensor as claimed in claim 12, wherein said diffusion control layer comprises at least one element selected from the group consisting of Ta, Hf, Zr, W, Cr, Ti, Mo, Pt, Ni, Ir, Cu, Ag, Co, Zn, Ru, Rh, Re, Au, Os, Pd, Nb and V.

14. An MR effect element as claimed in claim 12, wherein said diffusion control layer comprises one of a mixture of an oxide and a nitride both selected from the group consisting of Si, Ta, Al, Ti, V, Cr, Mn, Hf, Zr, W, Mo, Ni and Zn and a mixture of said oxide and said nitride.

15. An MR effect element as claimed in claim 12, wherein said diffusion control layer further comprises one of a mixture and a laminate of an oxide and a nitride both selected from the group consisting of Si, Ta, Al, Ti, V, Cr, Mn, Hf, Zr, W, Mo, Ni and Zn.

16. An MR sensing system comprising:

an MR effect sensor as claimed in any of claims 6, 7, 8, 9, 10, 11, 12, 13, 14, or 15;

means for producing a sense current to flow through said MR effect sensor; and means for sensing a change in an MR ratio of said MR effect sensor as a function of a magnetic field sensed.

17. A magnetic storage system comprising:

a magnetic recording medium having a plurality of tracks for recording data;

a magnetic recording system for writing data in said magnetic recording medium;

an MR sensing system as claimed in claim 16; and means connected to said magnetic recording system and said MR sensing system for effecting a movement to any one of the tracks of said magnetic recording medium selected.

* * * * *